(12) United States Patent
Holder et al.

(10) Patent No.: US 10,174,908 B2
(45) Date of Patent: *Jan. 8, 2019

(54) LED DEVICE FOR WIDE BEAM GENERATION

(71) Applicant: Illumination Management Solutions, Inc., Irvine, CA (US)

(72) Inventors: Ronald G. Holder, Laguna Niguel, CA (US); Greg Rhoads, Irvine, CA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 47 days.

This patent is subject to a terminal disclaimer.

(21) Appl. No.: 15/083,076

(22) Filed: Mar. 28, 2016

(65) Prior Publication Data

US 2016/0252230 A1    Sep. 1, 2016

Related U.S. Application Data

(60) Continuation of application No. 14/563,081, filed on Dec. 8, 2014, now Pat. No. 9,297,520, which is a
(Continued)

(51) Int. Cl.
*F21V 5/04* (2006.01)
*F21K 9/00* (2016.01)
(Continued)

(52) U.S. Cl.
CPC ............ *F21V 5/04* (2013.01); *F21K 9/00* (2013.01); *F21K 9/69* (2016.08); *F21S 8/085* (2013.01);
(Continued)

(58) Field of Classification Search
CPC .......... F21V 5/04; F21V 29/70; F21V 7/0091; F21V 13/04; F21V 19/02; F21V 23/005;
(Continued)

(56) References Cited

U.S. PATENT DOCUMENTS

| 1,758,977 A | 5/1930 | Rolph |
| 2,254,961 A | 9/1941 | Harris |
(Continued)

FOREIGN PATENT DOCUMENTS

| CN | 2750186 | 1/2006 |
| CN | 1737418 | 2/2006 |
(Continued)

OTHER PUBLICATIONS

Streetworks fixture from Cooper Lighting and 2 IES files, Aug. 14, 2001.
(Continued)

*Primary Examiner* — Bao Q Truong
(74) *Attorney, Agent, or Firm* — King & Spalding LLP

(57) ABSTRACT

An apparatus and method is characterized by providing an optical transfer function between a predetermined illuminated surface pattern, such as a street light pattern, and a predetermined energy distribution pattern of a light source, such as that from an LED. A lens is formed having a shape defined by the optical transfer function. The optical transfer function is derived by generating an energy distribution pattern using the predetermined energy distribution pattern of the light source. Then the projection of the energy distribution pattern onto the illuminated surface is generated. The projection is then compared to the predetermined illuminated surface pattern to determine if it acceptably matches. The process continues reiteratively until an acceptable match is achieved. Alternatively, the lens shape is numerically or analytically determined by a functional relationship between the shape and the predetermined illuminated surface pattern and predetermined energy distribution pattern of a light source as inputs.

20 Claims, 12 Drawing Sheets

Related U.S. Application Data continuation of application No. 13/858,713, filed on Apr. 8, 2013, now Pat. No. 8,905,597, which is a continuation of application No. 13/540,477, filed on Jul. 2, 2012, now Pat. No. 8,414,161, which is a continuation of application No. 13/109,609, filed on May 17, 2011, now Pat. No. 8,210,722, which is a continuation of application No. 12/690,794, filed on Jan. 20, 2010, now Pat. No. 7,942,559, which is a division of application No. 11/711,218, filed on Feb. 26, 2007, now Pat. No. 7,674,018.

(60) Provisional application No. 60/861,789, filed on Nov. 29, 2006, provisional application No. 60/777,310, filed on Feb. 27, 2006, provisional application No. 60/838,035, filed on Aug. 15, 2006.

(51) Int. Cl.
| | |
|---|---|
| *F21S 8/08* | (2006.01) |
| *G02B 27/00* | (2006.01) |
| *F21V 31/00* | (2006.01) |
| *G02B 19/00* | (2006.01) |
| *F21V 13/04* | (2006.01) |
| *F21V 29/70* | (2015.01) |
| *F21V 7/00* | (2006.01) |
| *F21V 19/02* | (2006.01) |
| *F21V 23/00* | (2015.01) |
| *F21K 9/69* | (2016.01) |
| *F21W 131/103* | (2006.01) |
| *H01L 33/58* | (2010.01) |
| *F21Y 105/16* | (2016.01) |
| *F21Y 115/10* | (2016.01) |

(52) U.S. Cl.
CPC ............ *F21S 8/086* (2013.01); *F21V 7/0091* (2013.01); *F21V 13/04* (2013.01); *F21V 19/02* (2013.01); *F21V 23/005* (2013.01); *F21V 29/70* (2015.01); *F21V 31/005* (2013.01); *G02B 19/0028* (2013.01); *G02B 19/0061* (2013.01); *G02B 19/0071* (2013.01); *G02B 27/0012* (2013.01); *F21W 2131/103* (2013.01); *F21Y 2105/16* (2016.08); *F21Y 2115/10* (2016.08); *H01L 33/58* (2013.01)

(58) Field of Classification Search
CPC .. F21V 31/005; F21K 9/69; F21K 9/00; F21S 8/085; F21S 8/086; G02B 19/0028; G02B 19/0061; G02B 19/0071; G02B 27/0012; F21Y 2105/16; F21Y 2115/10; F21W 2131/103; H01L 33/58
See application file for complete search history.

(56) References Cited

U.S. PATENT DOCUMENTS

| | | |
|---|---|---|
| 2,394,992 A | 2/1946 | Franck |
| 2,818,500 A | 12/1957 | Franck |
| 2,908,197 A | 10/1959 | Wells et al. |
| 3,278,743 A | 10/1966 | Franck |
| 3,596,136 A | 7/1971 | Fischer |
| 3,647,148 A | 3/1972 | Wince |
| 3,927,290 A | 12/1975 | Denley |
| 4,345,308 A | 8/1982 | Mouyard et al. |
| 4,460,945 A | 7/1984 | Chan |
| 4,729,076 A | 3/1988 | Masami |
| 4,734,836 A | 3/1988 | Negishi |
| 4,860,177 A | 8/1989 | Simms |
| 4,907,044 A | 3/1990 | Schellhorn et al. |
| 4,941,072 A | 7/1990 | Yasumoto |
| 5,404,869 A | 4/1995 | Parkyn |
| 5,424,931 A | 6/1995 | Wheeler |
| 5,636,057 A | 6/1997 | Dick et al. |
| 5,782,555 A | 7/1998 | Hochstein |
| 5,857,767 A | 1/1999 | Hochstein |
| 5,924,788 A | 7/1999 | Parkyn, Jr. |
| 5,926,320 A | 7/1999 | Parkyn |
| 5,939,996 A | 8/1999 | Kniveton et al. |
| 6,045,240 A | 4/2000 | Hochstein |
| 6,050,707 A | 4/2000 | Kondo et al. |
| 6,102,558 A | 8/2000 | Farnoux |
| 6,227,684 B1 | 5/2001 | Wijbenga |
| 6,227,685 B1 | 5/2001 | McDermott |
| 6,273,596 B1 | 8/2001 | Parkyn, Jr. |
| 6,341,466 B1 | 1/2002 | Kehoe et al. |
| 6,345,800 B1 | 2/2002 | Herst et al. |
| 6,441,558 B1 | 8/2002 | Muthu et al. |
| 6,461,008 B1 | 10/2002 | Pederson |
| 6,502,956 B1 | 1/2003 | Wu |
| 6,527,422 B1 | 3/2003 | Hutchison |
| 6,536,923 B1 | 3/2003 | Merz |
| 6,547,423 B2 | 4/2003 | Marshall et al. |
| 6,560,038 B1 | 5/2003 | Parkyn et al. |
| 6,582,103 B1 | 6/2003 | Popovich et al. |
| 6,598,998 B2 | 7/2003 | West et al. |
| 6,639,733 B2 | 10/2003 | Minano |
| 6,784,357 B1 | 8/2004 | Wang |
| 6,785,053 B2 | 8/2004 | Savage, Jr. |
| 6,837,605 B2 | 1/2005 | Reill |
| 6,850,001 B2 | 2/2005 | Takekuma |
| 6,895,334 B2 | 5/2005 | Yabe |
| 6,942,361 B1 | 9/2005 | Kishimura et al. |
| 6,948,838 B2 * | 9/2005 | Kunstler ............... F21S 48/215 362/237 |
| 6,965,715 B2 | 11/2005 | Lei |
| 6,997,580 B2 | 2/2006 | Wong |
| 7,070,310 B2 | 7/2006 | Pond et al. |
| 7,073,931 B2 | 7/2006 | Ishida |
| 7,090,370 B2 | 8/2006 | Clark |
| 7,102,172 B2 | 9/2006 | Lynch et al. |
| 7,104,672 B2 | 9/2006 | Zhang |
| 7,153,015 B2 | 12/2006 | Brukilacchio |
| 7,172,319 B2 | 2/2007 | Holder |
| 7,181,378 B2 | 2/2007 | Benifez |
| 7,204,627 B2 * | 4/2007 | Ishida .................. F21S 48/1154 257/E33.059 |
| 7,237,936 B1 * | 7/2007 | Gibson ................ F21S 48/1154 362/294 |
| 7,278,761 B2 | 10/2007 | Kuan |
| 7,281,820 B2 | 10/2007 | Bayat et al. |
| 7,322,718 B2 | 1/2008 | Setomoto et al. |
| D563,036 S | 2/2008 | Miyairi et al. |
| 7,329,029 B2 | 2/2008 | Chaves et al. |
| 7,329,030 B2 | 2/2008 | Wang |
| 7,329,033 B2 | 2/2008 | Glovatsky |
| 7,339,200 B2 | 3/2008 | Amano et al. |
| 7,347,599 B2 | 3/2008 | Minano et al. |
| 7,348,604 B2 | 3/2008 | Matheson |
| 7,348,723 B2 | 3/2008 | Yamaguchi et al. |
| 7,352,011 B2 | 4/2008 | Smits et al. |
| 7,374,322 B2 | 5/2008 | Steen et al. |
| 7,410,275 B2 * | 8/2008 | Sommers .................. F21V 5/04 362/257 |
| D577,852 S | 9/2008 | Miyairi et al. |
| 7,460,985 B2 | 12/2008 | Benitez |
| 7,461,948 B2 | 12/2008 | Van Voorst Vader et al. |
| 7,507,001 B2 | 3/2009 | Kit |
| 7,513,639 B2 | 4/2009 | Wang |
| 7,553,051 B2 | 6/2009 | Brass et al. |
| 7,569,802 B1 | 8/2009 | Mullins |
| 7,572,027 B2 | 8/2009 | Zampini, II |
| 7,572,654 B2 | 8/2009 | Chang |
| 7,575,354 B2 | 8/2009 | Woodward |
| 7,582,913 B2 | 9/2009 | Huang et al. |
| 7,618,162 B1 | 11/2009 | Parkyn et al. |
| 7,618,163 B2 | 11/2009 | Wilcox |
| 7,625,102 B2 | 12/2009 | Koike et al. |
| 7,637,633 B2 | 12/2009 | Wong |
| 7,651,240 B2 | 1/2010 | Bayat et al. |

(56) References Cited

U.S. PATENT DOCUMENTS

| | | | |
|---|---|---|---|
| 7,674,018 B2 | 3/2010 | Holder et al. | |
| 7,775,679 B2 | 8/2010 | Thrailkill et al. | |
| 7,777,405 B2 | 8/2010 | Steen et al. | |
| 7,809,237 B2 | 10/2010 | Pozdnyakov et al. | |
| 7,817,909 B2 | 10/2010 | Montgomery et al. | |
| 7,841,750 B2 | 11/2010 | Wilcox et al. | |
| 7,854,536 B2 | 12/2010 | Holder | |
| 7,891,835 B2 | 2/2011 | Wilcox | |
| 7,942,559 B2 | 5/2011 | Holder | |
| 7,972,035 B2 | 7/2011 | Boyer | |
| 7,972,036 B1 | 7/2011 | Schach et al. | |
| 7,993,036 B2 | 8/2011 | Holder et al. | |
| 8,007,140 B2 | 8/2011 | Zhang et al. | |
| 8,025,428 B2 * | 9/2011 | Duguay | F21S 8/086 362/249.02 |
| 8,210,722 B2 | 7/2012 | Holder et al. | |
| 8,382,338 B2 | 2/2013 | Lee | |
| 8,414,161 B2 * | 4/2013 | Holder | F21K 9/00 362/249.02 |
| 8,469,552 B2 | 6/2013 | Moeller | |
| 8,905,597 B2 * | 12/2014 | Holder | F21K 9/00 362/249.02 |
| 2002/0034081 A1 | 3/2002 | Serizawa | |
| 2002/0181222 A1 | 12/2002 | Boyd et al. | |
| 2002/0196623 A1 | 12/2002 | Yen | |
| 2003/0067787 A1 | 4/2003 | Serizawa | |
| 2003/0099115 A1 | 5/2003 | Reill | |
| 2004/0004828 A1 | 1/2004 | Chernick | |
| 2004/0037076 A1 | 2/2004 | Katoh et al. | |
| 2004/0070855 A1 * | 4/2004 | Benitez | G02B 3/02 359/858 |
| 2004/0105171 A1 | 6/2004 | Minano et al. | |
| 2004/0105261 A1 | 6/2004 | Ducharme | |
| 2004/0105264 A1 | 6/2004 | Spero | |
| 2004/0189933 A1 | 9/2004 | Sun et al. | |
| 2004/0207999 A1 | 10/2004 | Suehiro | |
| 2004/0218388 A1 | 11/2004 | Suzuki | |
| 2004/0222947 A1 | 11/2004 | Newton et al. | |
| 2004/0228127 A1 | 11/2004 | Squicciarini | |
| 2005/0073849 A1 | 4/2005 | Rhoads et al. | |
| 2005/0207165 A1 | 9/2005 | Shimizu et al. | |
| 2006/0034082 A1 | 2/2006 | Park | |
| 2006/0039143 A1 | 2/2006 | Katoh | |
| 2006/0081863 A1 | 4/2006 | Kim et al. | |
| 2006/0083003 A1 | 4/2006 | Kim et al. | |
| 2006/0138437 A1 | 6/2006 | Huang et al. | |
| 2006/0238884 A1 | 10/2006 | Jang | |
| 2006/0245083 A1 | 11/2006 | Chou et al. | |
| 2006/0250803 A1 | 11/2006 | Chen | |
| 2006/0255353 A1 | 11/2006 | Taskar | |
| 2006/0285311 A1 | 12/2006 | Chang et al. | |
| 2007/0019415 A1 | 1/2007 | Leblanc | |
| 2007/0019416 A1 | 1/2007 | Han | |
| 2007/0058369 A1 | 3/2007 | Parkyn et al. | |
| 2007/0063210 A1 | 3/2007 | Chiu | |
| 2007/0066310 A1 | 3/2007 | Haar | |
| 2007/0076414 A1 | 4/2007 | Holder | |
| 2007/0081338 A1 | 4/2007 | Kuan | |
| 2007/0081340 A1 | 4/2007 | Chung et al. | |
| 2007/0091615 A1 | 4/2007 | Hsieh et al. | |
| 2007/0183736 A1 | 8/2007 | Pozdnyakov | |
| 2007/0201225 A1 | 8/2007 | Holder | |
| 2007/0258214 A1 | 11/2007 | Shen | |
| 2008/0013322 A1 | 1/2008 | Ohkawa | |
| 2008/0019129 A1 | 1/2008 | Wang | |
| 2008/0025044 A1 | 1/2008 | Park et al. | |
| 2008/0043473 A1 | 2/2008 | Matsui | |
| 2008/0055908 A1 | 3/2008 | Wu | |
| 2008/0068799 A1 | 3/2008 | Chan | |
| 2008/0080188 A1 | 4/2008 | Wang | |
| 2008/0100773 A1 | 5/2008 | Hwang | |
| 2008/0174996 A1 | 7/2008 | Lu | |
| 2008/0239722 A1 | 10/2008 | Wilcox | |
| 2008/0273327 A1 | 11/2008 | Wilcox et al. | |
| 2009/0103308 A1 | 4/2009 | Xu et al. | |
| 2009/0244895 A1 | 10/2009 | Chen | |
| 2009/0262543 A1 | 10/2009 | Ho | |
| 2010/0014290 A1 | 1/2010 | Wilcox | |
| 2010/0296283 A1 | 11/2010 | Taskar et al. | |
| 2012/0044699 A1 | 2/2012 | Anderson | |
| 2014/0016326 A1 | 1/2014 | Dieker et al. | |

FOREIGN PATENT DOCUMENTS

| | | |
|---|---|---|
| DE | 202006015981 | 1/2007 |
| EP | 1431653 | 6/2004 |
| EP | 1621918 | 2/2006 |
| EP | 1686630 | 8/2006 |
| GB | 718425 | 11/1954 |
| GB | 794670 | 5/1958 |
| GB | 815609 | 7/1959 |
| JP | 06-177424 | 6/1994 |
| JP | 11-154766 | 9/1997 |
| JP | 2001-517855 | 9/1998 |
| JP | 2005-062461 | 3/2005 |
| JP | 2009-021086 | 1/2009 |
| KR | 10-2006-0033572 | 4/2006 |
| KR | 10-2006-0071033 | 6/2006 |
| KR | 20070015738 | 2/2007 |
| KR | 20100015957 | 2/2010 |
| KR | 20100105388 | 9/2010 |
| WO | WO 1996/24802 | 8/1996 |
| WO | WO 1998/33007 | 7/1998 |
| WO | WO 2003/044870 | 5/2003 |
| WO | WO 2004/068909 | 8/2004 |
| WO | WO 2005/041254 | 5/2005 |
| WO | WO 2005/057082 | 6/2005 |
| WO | WO 2005/093316 | 10/2005 |
| WO | WO 2007/100837 | 9/2007 |
| WO | WO 2008/144672 | 11/2008 |
| WO | WO 2010/19810 | 2/2010 |
| WO | WO 2011/098515 | 8/2011 |

OTHER PUBLICATIONS

Bisberg, *LED Magazine*, The 5mm. Package Versus the Power LED: Not a Light choice for the Luminaire Designer, pp. 19-21, Dec. 2005.
*LED Magazine*, p. 36 Oct. 2005.
International Search Report and Written Opinion for WO 2010-019810 dated Sep. 30, 2009.
International Search Report and Written Opinion for WO 2008-144672 dated Nov. 27, 2008.
ISR and Written Opinion of ISA, PCT-US07-05118 dated Mar. 11, 2008.
Bortz, "Optimal Design of a Non imaging Projection Lens for Use with an LED Light Source and a Rec-tangular Sheet." SPIE, pp. 130-138, vol. 4092, USA, published 2000.
International Search Report for PCT-US08-64168 dated Aug. 15, 2008.
Extended Search Report for EP Application No. 11006191 dated Nov. 7, 2011.
Extended Search Report for EP Application No. 11006189 dated Nov. 7, 2011.
Extended Search Report for EP Application No. 11006190 dated Nov. 7, 2011.
Timinger, Dr. Andreas, *High Performance Optics Design for LEDs*, Strategies in Light, Feb. 2005.
Ries, Harold & Julius Muschaweck, *Tailored Freeform Optical Surfaces*, Optical Society of America, vol. 19, No. 3, Mar. 2002.
Extended Search Report for EP Application No. 08755907.6 dated May 10, 2012.
Jolley L.B.W. et al., The Theroy and Design of Illuminating Engineering Equipment, 1931.
Order; Case No. 11-CV-34-JPS; United States District Court Eastern District of Wisconsin; Jun. 8, 2012; (referencing U.S. Pat. No. 7,674,018 and U.S. Pat. No. 7,993,036).
International Search Report for PCT-US11-049388 dated Apr. 9, 2012.

(56) References Cited

OTHER PUBLICATIONS

Timinger, Andreas, Strategies Unlimited, "Charting New Directions in High-Brightness LED's," Strategies in Light, Feb. 5-7, 2003.
Timinger, Andreas, "Optical Design for LED-Street Lamps," Conference Paper, Solid-State and Or-ganic Lighting (SOLED), Karlsruhe, Germany, Jun. 21, 2010.
Order, Case No. 11-CV-34-JPS; United States District Court Eastern District of Wisconsin; filed Oct. 31, 2012.
LED's Magazine; High-Power LED's; multi-watt LED light Engines Offer Challenges and Opportuni-ties; ledmagazine.com Oct. 2005.
Timinger, "Tailored Optical Surfaces Step up Illumination Design," Europhonics; Aug.-Sep. 2002 (color copy).
Plantiff Illumination Management Solutions, Inc.'s Initial Claim Construction Brief; Case No. 2:11-cv-00034 JPS; Apr. 5, 2012.
Ruud Lighting's Notice Pursuant to 35 U.S.C. §282; Civil Action 2:11-cv-00034-JPS; Oct. 12, 2012.
Expert Report of Dr. Roland Winston Regarding Invalidity, Civil Action 2:11-cv-00034-JPS; Jul. 17, 2012; Exhibits A-C.
Expert Report of Dr. Rick Mistrick; Validity of the '018 and '036 Patents; Civil Action 2:11-cv-00034-JPS; Aug. 17, 2012.
Expert Report of Dr. Rick Mistrick; Rebuttal of Dr. Roland Winston; Civil Action 2:11-cv-00034-JPS; Aug. 17, 2012.
Expert Report of Waqidi Falicoff; Civil Action 2:11-cv-00034-JPS; Jul. 17, 2012; Exhibits 1-24.
Aoyama, Y.; Yachi, T., "An LED Module Array System Designed for Streetlight Use," Energy 2030 Conference, 2008. Energy 2008. IEEE , vol., No., pp. 1-5, Nov. 17-18, 2008, doi: 10.1109/ENERGY.2008.4780996; URL: http://ieeexplore.ieee.org/stamp/stamp.jsp?tp=&arnumber=4780996&isnumber=4780986.
Petroski, J.; Norley, J.; Schober, J.; Reis, B.; Reynolds, R.A.; , "Conduction cooling of large LED array systems," Thermal and Thermomechanical Phenomena in Electronic Systems (ITherm), 2010 12th IEEE Intersociety Conference on , vol., No., pp. 1-10, Jun. 2-5, 2010; doi: 10.1109/ITHERM.2010.5501350; URL: http://ieeexplore.ieee.org/stamp/stamp.jsp?tp=&arnumber=5501350&isnumber=5501251.
Wankhede, M.; Khaire, V.; Goswami, A.; Mahajan, S.D.; , "Evaluation of Cooling Solutions for Out-door Electronics," Electronics Packaging Technology Conference, 2007. EPTC 2007. 9th , vol., No., pp. 858-863, Dec. 10-12, 2007; doi: 10.1109/EPTC.2007.4469682; URL: http://ieeexplore.ieee.org/stamp/stamp.jsp?tp=&arnumber=4469682&isnumber=4469670.
International Search Report for PCT/US2012/026971; dated Sep. 27, 2012.
European Search Report for application No. 09807313.3, dated Sep. 25, 2014.
European Search Report for application No. 15170016, dated Nov. 16, 2015.

* cited by examiner

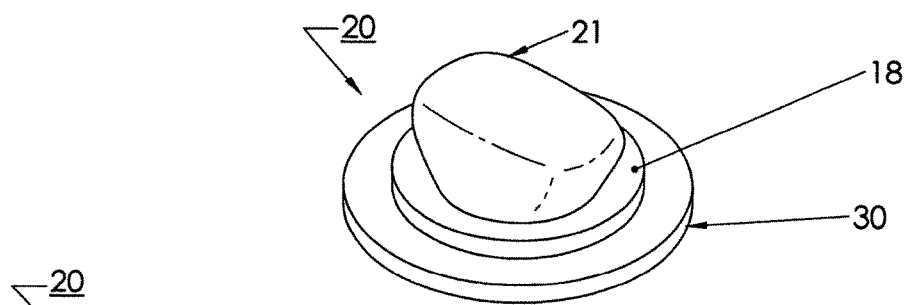
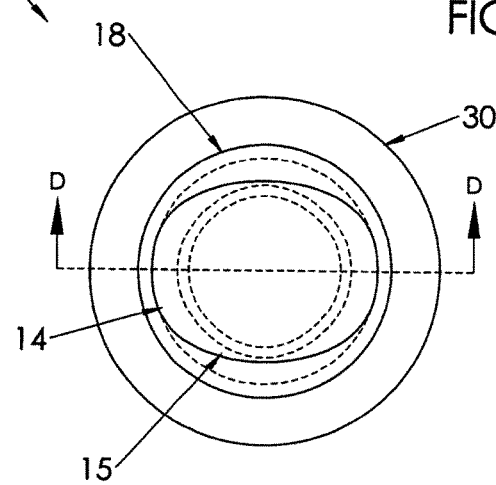
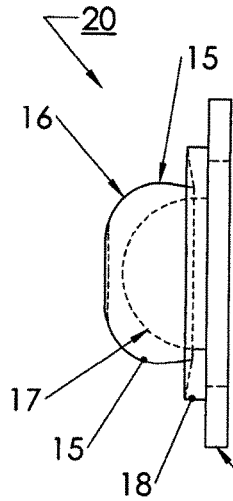
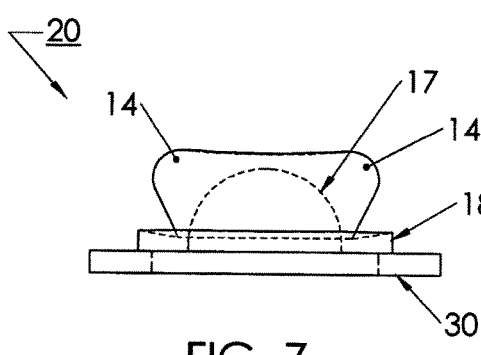
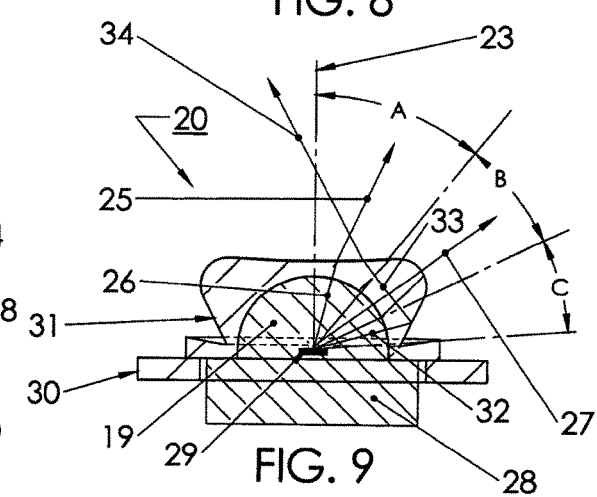

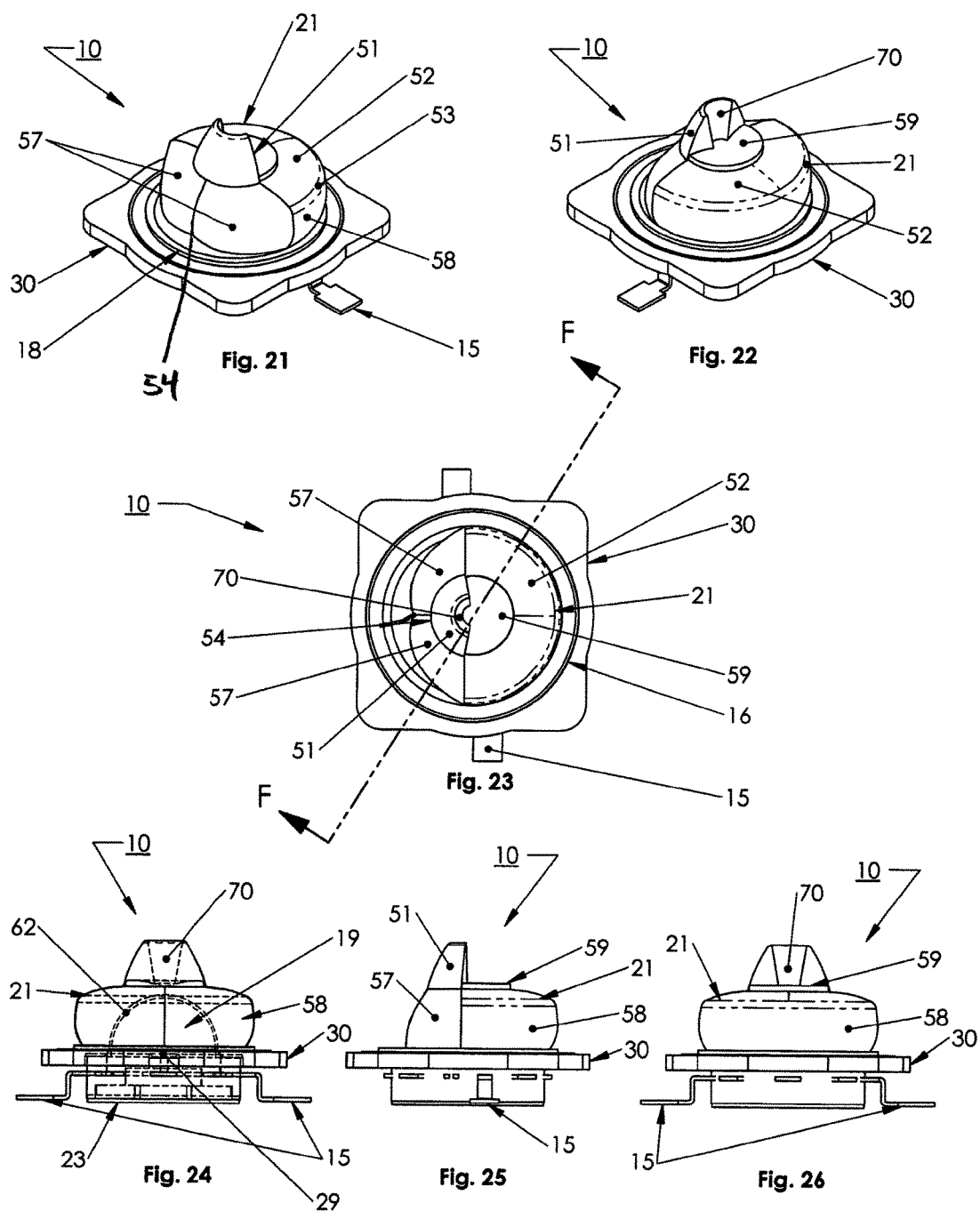

LED DEVICE FOR WIDE BEAM GENERATION

RELATED APPLICATIONS

The present application is a continuation of and claims priority under 35 U.S.C. § 120 to U.S. patent application Ser. No. 14/563,081 filed on Dec. 8, 2014, which is a continuation of and claims priority to U.S. patent application Ser. No. 13/858,713 filed on Apr. 8, 2013, which is a continuation of U.S. patent application Ser. No. 13/540,477 filed on Jul. 2, 2012, now U.S. Pat. No. 8,414,161, which was a continuation of U.S. patent application Ser. No. 13/109,609 filed on May 17, 2011, now U.S. Pat. No. 8,210,722, which was a continuation of U.S. patent application Ser. No. 12/690,794 filed on Jan. 20, 2010 now U.S. Pat. No. 7,942,559; which was a division of U.S. patent application Ser. No. 11/711,218 filed on Feb. 26, 2007 now U.S. Pat. No. 7,674,018, which claims priority under 35 U.S.C. § 119 to U.S. Provisional Patent Application Ser. No. 60/777,310, filed on Feb. 27, 2006; U.S. Provisional Patent Application Ser. No. 60/838,035, filed on Aug. 15, 2006; and U.S. Provisional Patent Application Ser. No. 60/861,789, filed on Nov. 29, 2006, each of which are incorporated herein by reference. This application is also related to U.S. patent application Ser. No. 12/690,821 filed on Jan. 20, 2010 now U.S. Pat. No. 7,993,036; and U.S. patent application Ser. No. 13/109,582 filed on May 17, 2011.

BACKGROUND OF THE INVENTION

Field of the Invention

The invention relates to the field of apparatus and methods for using light emitting diodes (LEDs) or other light sources to generate predetermined wide profile two dimensional illumination patterns using a light source which has been optically modified to provide a corresponding wide profile beam or a flat array of multiple ones of such modified light sources.

Description of the Prior Art

The initial investment cost of LED illumination is expensive when compared with traditional lighting means using cost per lumen as the metric. While this may change over time, this high cost places a premium on collection and distribution efficiency of the LED optical system. The more efficient the system, the better the cost-benefit comparison with traditional illumination means, such as incandescent, fluorescent and neon.

A traditional solution for generating broad beams with LEDs is to use one or more reflectors and/or lenses to collect and then spread the LED energy to a desired beam shape and to provide an angled array of such LEDs mounted on a curved fixture. Street light illumination patterns conventionally are defined into five categories, Types I-V. Type 1 is an oblong pattern on the street with the light over the center of the oblong. Type II is a symmetric four lobed pattern with the light over the center of the lobed pattern. Type III is a flattened oblong pattern with the light near the flattened side of the oblong. Type IV is parabolic pattern with a flattened base with the light near the flattened base. Type V is a circular pattern with the light over the center of the circle. Any asymmetric aspect of these categorical patterns is obtained by mounting the light sources in a curved armature or fixture. By curving or angling the fixture to point the LEDs or light sources in the directions needed to create a broad or spread beam onto a surface, such as a street, a portion of the light is necessarily directed upward away from the street into the sky. Hence, all airplane passengers are familiar with the view of a lighted city at night on approach. This often dazzling display is largely due to street lights and more particularly to street lights that have canted fixtures to create spread beams and hence collectively direct a substantial amount of light skyward toward approaching aircraft. In an efficiently lighted city, the city would appear much darker to aircraft, because the street lights should be shining only onto the street and not into the sky. The dazzling city lights seen from aircraft and hill tops may be romantic, but represent huge energy losses, unnecessary fuel usage, and tons of unnecessary green house gas emissions from the electrical plants needed to generate the electricity for the wasted light.

Another technique is to use a collimating lens and/or reflector and a sheet optic such as manufactured by Physical Devices Corporation to spread the energy into a desired beam. A reflector has a predetermined surface loss based on the metalizing technique utilized. Lenses which are not coated with anti-reflective coatings also have surface losses associated with them. The sheet material from Physical Optics has about an 8% loss.

One example of prior art that comes close to a high efficiency system is the 'Side-emitter' device sold by Lumileds as part of their LED packaging offerings. However, the 'side-emitter' is intended to create a beam with an almost 90 degree radial pattern, not a forward beam. It has internal losses of an estimated 15% as well. Another Lumileds LED, commonly called a low dome or bat wing LED, has a lens over the LED package to redirect the light, but it is to be noted that it has no undercut surface in the lens for redirecting the light from the LED which is in the peripheral forward solid angle. Similarly, it is to be noted that the conventional 5 mm dome lens or packaging provided for LEDs lacks any undercut surface in the dome at all.

What is needed is an device that creates a wide angle beam, even the possibility of a nonradially symmetric beam, that can be created with a design method that allows the al designer to achieve a smooth beam profile which is not subject to the inherent disadvantages of the prior art.

BRIEF SUMMARY OF THE INVENTION

The illustrated embodiment of the invention includes a method of providing a predetermined illuminated surface pattern from a predetermined energy distribution pattern of a light source comprising the steps of defining an estimated optical transfer function of a lens shape; generating an energy distribution pattern using the estimated optical transfer function of a lens shape from the predetermined energy distribution pattern of the light source; generating a projection of the energy distribution pattern onto the illuminated surface; comparing the projection of the energy distribution pattern to the predetermined illuminated surface pattern; modifying the estimated optical transfer function of the lens shape; repeating the steps of generating the energy distribution pattern using the estimated optical transfer function of the lens shape from the predetermined energy distribution pattern of the light source, generating the projection of the energy distribution pattern onto the illuminated surface, and comparing the projection of the energy distribution pattern to the predetermined illuminated surface pattern until acceptable consistency between the projection of the energy distribution pattern and the predetermined illuminated surface pattern is obtained; and manufacturing a lens with the last obtained estimated optical transfer function.

In one embodiment the predetermined illuminated surface pattern is a street lighting pattern and the predetermined energy distribution pattern of the light source is a LED Lambertian pattern so that what is manufactured is a lens for a street light.

The method further comprises the step of assembling a plurality of light sources optically each combined with the manufactured lens to form a corresponding plurality of devices, each having an identical energy distribution pattern, to provide a linearly additive array of devices to produce the predetermined illuminated surface pattern.

In one embodiment each array is manufactured as a modular unit and the method further comprises the step of scaling the intensity of the illumination pattern on the target surface without substantial modification of the illumination pattern by modular scaling of the arrays into larger or smaller collections.

The illustrated embodiment of the invention is also an improvement in an apparatus for providing an optical transfer function between a predetermined illuminated surface pattern and a predetermined energy distribution pattern of a light source comprising a lens having a shape defined by the optical transfer function which is derived by generating an energy distribution pattern using the predetermined energy distribution pattern of the light source and then generating a projection of the energy distribution pattern onto the illuminated surface from the energy distribution pattern, which projection acceptably matches the predetermined illuminated surface pattern.

In one embodiment the predetermined illuminated surface pattern is a street lighting pattern and the predetermined energy distribution pattern of the light source is a LED Lambertian pattern.

An embodiment of the claimed invention also includes a light source combined with the lens.

The illustrated embodiment is also an improvement in a lens for use in an apparatus for providing a predetermined illuminated surface pattern from a predetermined energy distribution pattern of a light source comprising an undercut surface defined on the lens, the lens having a base adjacent to the light source, a lens axis and a surface between the base and lens axis, the undercut surface extending from the base of the lens at least partially along the surface of the lens toward the lens axis to generate an energy distribution pattern using the predetermined energy distribution pattern of the light source which will then generate a projection of the energy distribution pattern onto the illuminated surface, which projection acceptably matches the predetermined illuminated surface pattern.

The undercut surface comprises portions which refract light and which totally internally reflect light from the light source into the energy distribution pattern.

The undercut surface comprises portions which direct light from the light source into a broad spread beam.

The illustrated embodiment is also an improvement in an apparatus for providing an optical transfer function between a predetermined illuminated surface pattern and a predetermined energy distribution pattern of a light source comprising an undercut surface of a lens having a shape defined by the optical transfer function which shape is derived by generating an energy distribution pattern using the predetermined energy distribution pattern of the light source and then generating a projection of the energy distribution pattern onto the illuminated surface from the energy distribution pattern, which projection acceptably matches the predetermined illuminated surface pattern.

The illustrated embodiment is also an improvement in a lens surface for use in an apparatus for providing a predetermined illuminated surface pattern from a predetermined energy distribution pattern of a light source, where the lens is characterized by an energy distribution pattern with two opposing sides, the improvement comprising a complex prism defined as part of the lens surface, the complex prism being arranged and configured to transfer energy from one side of the energy distribution pattern to the opposing side to render the energy distribution pattern asymmetric with respect to the two opposing sides.

The illustrated embodiment is also an array for providing a predetermined illuminated surface pattern comprising a plurality of light emitting devices for providing the predetermined illuminated surface pattern, each device having an identical energy distribution pattern which produces the predetermined illuminated surface pattern, a circuit driver coupled to each of the devices, and a planar carrier in which the plurality of light emitting devices are arranged to provide a spatially organization of the array to collectively produce a linearly additive illumination pattern matching the predetermined illuminated surface pattern.

Each array is a modular unit capable of being readily combined with a like array and further comprising a collection of arrays for scaling the intensity of the illumination pattern on the target surface without substantial modification of the illumination pattern by modular scaling of the arrays into a larger or smaller collection.

The array further comprises a plurality of circuit drivers, one for each device and where the plurality of circuit drivers are mounted on or attached to the carrier. The carrier comprises a printed circuit board to which the plurality of circuit drivers and devices are coupled, a cover for sealing the printed circuit board, circuit drivers and devices between the cover and carrier. The devices are optionally provided with a flange or an indexing flange and where the devices are angularly oriented with respect to the cover and carrier by the indexing flange. The printed circuit board, circuit drivers and devices are optionally sealed between the cover and carrier by means of a potting compound disposed between the cover and carrier in which potting compound the circuit drivers and devices as coupled to the printed circuit board are enveloped to render the array submersible.

Another embodiment of the invention is a luminaire for a street light to provide a predetermined illumination pattern on a street surface comprising a lighting fixture, and a plurality of arrays of light emitting devices disposed in the lighting fixture, each array for providing the predetermined illumination pattern on the street surface.

The array in the luminaire for providing a predetermined illuminated surface pattern comprises a plurality of light emitting devices for providing the predetermined illuminated surface pattern, each device having an identical energy distribution pattern which produces the predetermined illuminated surface pattern, a circuit driver coupled to each of the devices; and a planar carrier in which the plurality of light emitting devices are arranged to provide a spatially organization of the array to collectively produce a linearly additive illumination pattern matching the predetermined illuminated surface pattern.

In one embodiment each of the light emitting devices in the luminaire comprises a light source and a lens with a lens surface, the lens for providing the predetermined illuminated surface pattern from a predetermined energy distribution pattern of a light source, where the lens is characterized by an energy distribution pattern with two opposing sides, the lens surface comprising a complex prism defined as part of the lens surface, the complex prism being arranged and configured to transfer energy from one side of the energy distribution pattern to the opposing side to render the energy distribution pattern asymmetric with respect to the two opposing sides.

In another embodiment each of the light emitting devices in the luminaire comprises a light source and a lens with a lens surface, the lens for providing the predetermined illuminated surface pattern from a predetermined energy distribution pattern of a light source, the lens for providing an optical transfer function between the predetermined illuminated surface pattern and the predetermined energy distribution pattern of a light source, the lens having an undercut surface with a shape defined by the optical transfer function which shape is derived by generating an energy distribution pattern using the predetermined energy distribution pattern of the light source and then generating a projection of the energy distribution pattern onto the illuminated surface from the energy distribution pattern, which projection acceptably matches the predetermined illuminated surface pattern.

In one embodiment each of the light emitting devices in the luminaire comprises a light source and a lens with a lens surface, the lens for providing the predetermined illuminated surface pattern from a predetermined energy distribution pattern of a light source, the lens having an undercut surface, the lens having a base adjacent to the light source, a lens axis and a surface between the base and lens axis, the undercut surface extending from the base of the lens at least partially along the surface of the lens toward the lens axis to generate an energy distribution pattern using the predetermined energy distribution pattern of the light source which will then generate a projection of the energy distribution pattern onto the illuminated surface, which projection acceptably matches the predetermined illuminated surface pattern.

In another embodiment each of the light emitting devices in the luminaire comprises a light source and a lens with a lens surface, the lens for providing the predetermined illuminated surface pattern from a predetermined energy distribution pattern of a light source, the lens having a shape defined by the optical transfer function which is derived by generating an energy distribution pattern using the predetermined energy distribution pattern of the light source and then generating a projection of the energy distribution pattern onto the illuminated surface from the energy distribution pattern, which projection acceptably matches the predetermined illuminated surface pattern.

Another one of the illustrated embodiments is a luminaire for a street light to provide a predetermined illumination pattern on a street surface, the predetermined illumination pattern having a defined horizon, comprising a lighting fixture, and a plurality of planar arrays of light emitting devices disposed in the lighting fixture, each array for providing the predetermined illumination pattern on the street surface with substantial reduction of light directed from the luminaire to the horizon or above.

The illustrated embodiment of the invention is comprised of a light source, such as a light emitting diode (LED) and a lens. It is to be understood that for the purposes of this specification that a "lens" is to be understood throughout as an optical element which is capable of refraction, reflection by total internal reflecting surfaces or both. Hence, the more general term, "optic" could be used in this specification interchangeably with the term, "lens". The lens is characterized by directing light from the light source into a smooth, broad beam, which when projected onto an illumined surface has a 50 percent of maximum foot-candle measurement at an angle greater than 15 degrees from the centerline of the illumination pattern, i.e. a 30 degree full width, half maximum. The lens comprises a transparent or translucent "blob-like" or dimpled-puddle shape, such as plastic or glass, that encompasses the light source or LED emitter to generate a high angle intensity wide beam without, in the preferred embodiment, adding any additional surface losses, either reflective or refractive than the LED would cause itself in this configuration of the invention. Almost all the energy of the LED is directed into the beam without losses much in excess of those generated by the LED without the lens deployed.

The lens comprises a transparent or translucent "blob-like" or dimpled-puddle shape, which produces a high angle intensity wide beam without adding any additional surface losses, either reflective or refractive than the LED would cause itself in this configuration of the invention. Almost all the energy of the LED is directed into the beam without losses much in excess of those generated by the LED without the lens deployed.

In one embodiment the lens is separate from the LED and is glued, affixed or disposed on the light source or original LED protective dome with an index matching material so as to virtually eliminate the seam or any optical discontinuity between the two. In another embodiment the lens is manufactured as the protective dome of the LED.

The lens is characterized by a "blob" zone which is a small concentrating zone that is formed along the desired primary director of the lens and light source. The blob zone comprises a surface portion of the lens which collects the light rays emitted by the LED and sends them along a predetermined direction dependent on the desired beam angle. The nearby surrounding surface portion of the lens also collects light from the LED emitter and bends it toward the preferential direction.

The blob zone comprises has a central forward cross-section which smoothly apportions light from a directed zone to the centerline. The portion of the lens which collects the peripheral light of the LED emitter either bends the light rays toward the preferential direction and/or internally reflects the light rays through the forward surface of the lens.

In one embodiment the lens produces a beam that is a function of the azimuthal angle of the beam and thus the lens has a cross-section which varies as function of the azimuthal angle around the optical axis. In the illustrated embodiment the azimuthal light pattern has a multiple lobed distribution of intensity.

In one embodiment of this type the lens also directs the beam in one or more directions offset from the projected centerline of the device. The lens includes additional surface shapes or a complexly shaped prism that add further control to the beam composition. Such additional surface shapes include facets, a multiple surface Fresnel type flattening of shape or prism, diffusing techniques or other lens surface enhancements, modifications or treatments.

One major advantage of a device of the invention is the ability to generate the required beam pattern with an array of LEDs which are mounted on a flat or planar plate, which most likely would be parallel to the street or floor. Thus eliminating the need for a complex armature. The illustrated embodiment further comprises a plurality of light sources or LEDs and corresponding lenses as describe above combined into a flat array of bars or plates to provide thermal and electrical distribution required for the LEDs as well as provide means for sealing the array from environmental damage. The apparatus further comprises circuitry to drive the LEDs included in the array. It is contemplated that each of the lenses are individually rotated to create a beam pattern for the flat array that is unique from the devices themselves, including all degrees of freedom, e.g. separately determined translation, tilt and yaw for each lens. The array could comprise similarly colored LEDs, white or otherwise, or optionally various colored LEDs.

The bars or plates each comprise an extruded or die-cast bar of aluminum or other thermally conductive material to which the LEDs are bonded directly, and a printed circuit board to connect the LEDs to a power source. In one embodiment the circuit board is laminated to the extruded or die-cast bar.

Each LED optionally incorporates a skirt, which is utilized to provide a sealed array with a cover, potting compound or other covering means.

The invention further comprises a method of providing a light pattern using any one of the devices or arrays described above.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The invention can be better visualized by turning now to the following drawings wherein like elements are referenced by like numerals.

BRIEF DESCRIPTION OF THE DRAWINGS

FIG. 5 is a top view of another embodiment where the device is not radially symmetric. This view illustrates an embodiment which has two horizontally opposed lobes of the 'blob' lens.

FIG. 6 is an isometric view of the device of FIG. 5 more clearly describing its nonradially symmetric shape.

FIG. 7 is a side plan view of the device of FIG. 5 as seen parallel to section line D-D showing the reversal or undercut in the outline of the lens.

FIG. 8 is a side plan view that is rotated 90 degrees from the side view of FIG. 7.

FIG. 9 is a cross-sectional view through section line 'D-D' of the device described in FIG. 5. This cross-section shows the LED in addition to the lens.

FIG. 21 is a perspective view of another embodiment of the invention using a complexly shaped prism. This embodiment is for streetlight and similar applications. It is azimuthally asymmetric and is oriented in the figure to show the 'curb' side of the streetlight or that side to which less light is directed.

FIG. 22 is a rotated perspective view of the device depicted in FIG. 21 showing the 'street' side of the device or that side of the device to which more light is directed.

FIG. 23 is a 'bottom' view of the device of FIGS. 21 and 22 showing the 'street' side on the right of the view and the curb side on the left of the view.

FIG. 24 is a side plan view of the embodiment of the invention described in FIGS. 21-23 showing in phantom outline the LED on which the lens of the device is mounted.

FIG. 25 is a rotated side plan view of the device of FIGS. 21-24 orthogonal to the view of FIG. 24.

FIG. 26 is a rotated side plan view of the device of FIGS. 21-25 orthogonal to the view of FIG. 25.

FIG. 31 is a cross-sectional view of the curb side of the device.

Figure 1:
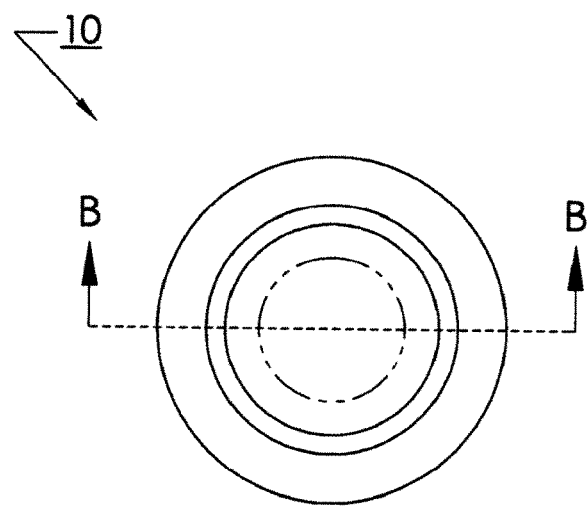
FIG. 1 is a top plan view of one embodiment of the invention in which a section line B-B is defined. This embodiment is radially symmetric.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

Before turning to the specifically illustrated examples shown in the drawings, we consider the various embodiments of the invention in more general terms. The illustrated embodiment of the invention uses light emitting diodes (LED), or other light sources, in a device that directs the energy from the LED into a smooth, broad beam. A broad beam can best be described as a beam which provides an illumination pattern on the surface intended to be illuminated, (e.g. the street, sidewalk, wall, etc.) that has a 50 percent maximum foot-candle measurement at an angle greater than 15 degrees from the centerline of the illumination pattern. This is referred to in the lighting field as the half-maximum point. A light source with a 15 degree half maximum measurement is also described as a 30 degree FWHM (Full Width, Half Maximum) light source.

Since light energy dissipates as the square of the distance from the source and there is additionally a cosine falloff based on the angle of incidence with respect to the illuminated plane, a wide angle beam of light requires considerably more intensity at high angles from its centerline than at its centerline. A good metric to use to analyze the required intensity is an iso-candela map. This radial map shows intensity verses degrees from the centerline of a light source or a luminaire.

The preferred embodiment of the invention has a transparent 'blob-like' or complexly shaped lens, most likely of plastic or glass, that optically modifies light from the LED to generate the high angle intensity required for the wide beam angles without adding much if any additional reflective or refractive surface losses, other than what the LED packaging causes itself. The complex shape of the lens is determined by a transfer function that is disclosed below. It is the lack of additional surface losses that allow the preferred embodiment of the invention to be extremely efficient. However, it must be expressly understood that the scope of the invention contemplates designs that may depart from this efficiency standard to accommodate manufacturing artifacts or other compromises for the sake of economic production. In the preferred embodiment of the invention the lens is 'glued' to the original LED protective cover with an index matching material so as to virtually eliminate the seam between the two. In another preferred embodiment of the invention the lens is integrally manufactured into the protective dome or cover of the LED package.

The 'blob' zone is a small concentrating lens zone that is formed along the desired primary director of the device. This blob zone of the lens collects the light rays emitted by the LED and sends them along a predetermined direction, i.e. the primary director, dependent on the beam angle desired by the optical designer. In the illustrated embodiment, the lens will be first considered to be a surface of revolution with a centerline or axis aligned with the centerline of the LED light pattern. However, additional embodiments will be disclosed where this azimuthal symmetry is broken. The nearby surrounding surface of the lens to the blob zone also collects light from the LED emitter and refracts it toward the preferential direction. The shape of the central forward cross-section of the lens gently apportions the energy in the segment from the directed blob zone to the centerline. The interior cross-sectional surface of the lens that is struck by the peripheral energy of the LED emitter is in a preferred embodiment undercut to either refract the light rays toward the preferential direction and/or internally reflect the light rays through the forward surface of the lens. The undercut surface of the lens is characterized by a smaller outer diameter defined from the centerline of the lens at the base of the lens than the outer diameter of the lens in the blob zone. In other words, the surface of the lens falls away or narrows at some point as the base of the lens is approached. Typically, an undercut surface could not be made in a single-piece mold, but would require a multiple piece mold for release. In the preferred embodiment of the invention, almost all the energy of the LED is directed into the radiated beam without losses in excess of those generated by the LED without the invention deployed. Again, this is not to be understood as a limitation of the invention, which may include embodiments where greater losses than the native LED losses are permitted for various economic or manufacturing conveniences.

One of the preferred embodiments of the invention generates a beam that has a differential of angles, and therefore intensities, in its two primary axes. In this instance the 'blob' cross-section of the lens varies as a function of the azimuthal angle about the centerline axis. This embodiment is intended for use in street lights and walkway lights or any use where there is a requirement for an asymmetrical or anamorphic beam. The iso-candela map of such a luminaire is nonuniform about its axes. Although it would be unusual, it is nevertheless contemplated within the scope of the invention that there could be more than two lobes along the opposing axes, such as a three, four or even more 'blob' axes.

One LED is hardly ever enough for a street light or parking lot light, so it is the preferred embodiment of the invention that a plurality of devices would be utilized in an array. It is expected that such an array might also be devised with two or more different 'blob' optical configurations to enhance the overall beam pattern. In the preferred embodiment, the array is disposed in a flat or planar arrangement as a module that can be readily scaled in size.

The device is generally described as being used in the field of general lighting illumination, but it could be used in niche markets in the field of lighting and illumination as well. Uses of the invention include, but are not limited to, street lighting, parking structure lighting, pathway lighting or any indoor or outdoor venues where a broad beam of light is desired, and is either azimuthally symmetric or biased in one or more axial directions. The illustrated embodiment can also be used to advantage in mobile lighting in vehicles, aircraft, trains, vessels and the like. The number and variety of applications in which use can be made are too numerous to even attempt to list.

While the drawings may describe what appears to be a simple concept, the short distance from a relatively large emitter to small surface presents many design challenges. Even a very small, 0.002", change in surface position or curvature or small angle change, 0.05 degree, can throw the intended beam into disarray with bad visual artifacts or 'rings' in the resultant beam.

In another embodiment of the invention, a beam is generated that is offset in one or more axes from the projected centerline of the device. The resultant beam can be used, for example, to generate a Type III roadway lighting luminaire which requires a beam pattern that has its primary director to be offset from its nadir. The lens appears to be a freeform shape with cross-sections that that may have tilted lobes and surfaces that cause individual rays of the beam to refract in a skewed manner. In addition to the surfaces that define the majority portion of the beam, the embodiment also includes additional surface shapes, like a complex prism, that add further control to the composition of the composite beam. It is also anticipated that facets, Fresnel type flattening of surface shapes in the form of complex prism, diffusing techniques or other surface enhancements may be added to lens to obtain a certain effect within the beam.

The term, beam, is not often associated with highly divergent illumination devices, but it is used in this specification to describe the collectively formed output of the device, and is not necessarily limited a narrow beam of light.

Figure 2:
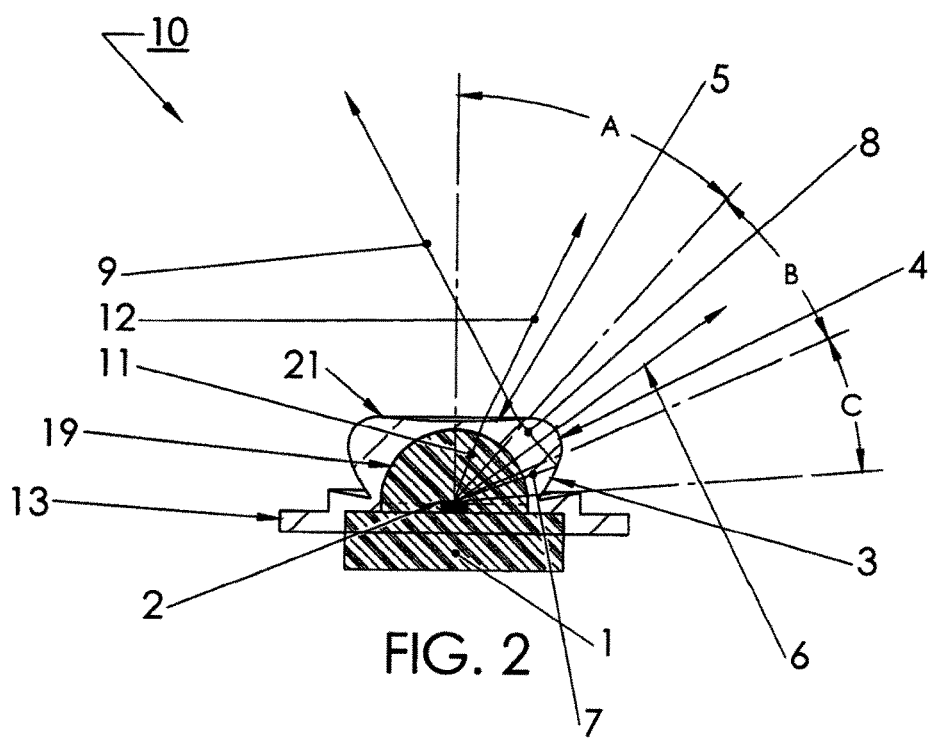
FIG. 2 is the side cross sectional view depicted in FIG. 1 through section lines 'B-B'.

Turn now to FIGS. 1-4 wherein the details of the illustrated embodiment of the invention depicted is azimuthally symmetric. FIG. 1 is an orthogonal top plan view of the device, generally denoted by reference numeral 10. FIG. 2 shows the device 10 in a cross-sectional view in position on LED 1, which is a conventional packaged LED. LED emitter 2 is positioned on the axis of the device 10 and in the embodiment shown the emitter 2 is centered in a hemispherical cavity (not shown) defined in a transparent, hemispherical protective dome 19 of the device 10. In this embodiment the hemispherical cavity is filled with a material whose index of refraction matches that of the protective dome 19 of the LED 1 to virtually eliminate the cavity defining interior surface of dome 19 from causing any losses or providing any refraction. In FIG. 2 three solid angles or zones of interest, A, B and C, are depicted. These zones are for reference only and some embodiments of the invention may have more or fewer zones. As shown, zone A represents surface 5 of the lens 21 into which the forward solid angle of energy emitted from LED emitter 2 is collected, represented by rays 11 and 12. Ray 11 is transmitted within the lens 21 from emitter 2 to the surface of lens 21 and ray 12 is the refracted into zone A through the surface of the lens 21. Zone B represents the surface 4 of the lens 21 referred to as the 'blob' zone. This surface 4 is situated on either side of the intended main director 6 at the approximate angle of the beam's highest desired intensity. Zone C represents the undercut surface 3 which collects the remaining peripheral forward solid angle of energy from the LED emitter 2 as represented by rays 7, 8 and 9. Ray 7 is transmitted from emitter 2 to the surface 3 within lens 21, is totally internally reflected as ray 8 and then is refracted by surface 5 as ray 9. However, it must be understood that some or, if desired, most of the rays from emitter 2 incident on surface 3 will not be internally reflected, but intentionally refracted through surface 3 as peripheral rays.

Optional flange 13 can be of most any desirable shape and is utilized for sealing the device 10 and/or any proximate portion of a light module manufactured with the device as described below. The shape of flange 13 may be configured to provide for indexing or azimuthal alignment to a fixture in which device 10 of FIGS. 1-4 or particularly device 20 of FIGS. 5-9, whose radiation pattern is not azimuthally symmetric, is set or may provide a snap fit connection of device 10 into the fixture.

In FIG. 2, surface 3 of the depicted embodiment of the invention 10 can be designed to be either totally internally reflective (TIR) or refractive or both. Surfaces 4 and 5 are intended to be primarily refractive.

Figure 3:
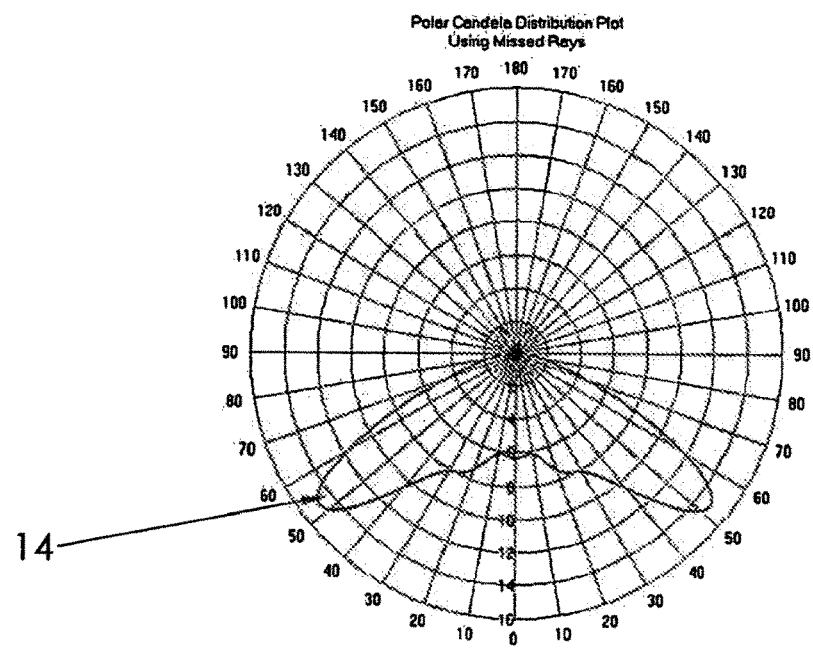
FIG. 3 is a polar candela plot of the embodiment of the invention described in FIGS. 1 and 2. The zero direction is the centerline of the device.

The method used to design the embodiment shown is to first select the primary director angle 6 for the highest intensity, shown in the polar graph of FIG. 3 as point 14. It has been determined by empirical testing that if this director angle passes much beyond 60-62 degrees from the centerline, the resultant effect is to limit the ability of the device 10 to perform its primary task of providing a significant increase in the iso-candela plot of the off-axis energy as shown by point 14 of FIG. 3 and still achieve the goal of a smooth, useful beam. In the embodiment of FIG. 3 the maximum intensity occurs at about 52 degrees off axis.

In cross-section, surface 4 of zone B is defined as an arc which has its center disposed along the director 6. The radius and the start and end angles of the arc defining surface 4 are variables defined by iteration with the surface definitions of zones A and C. The surface 5 is defined as a concave refractive surface intended in this embodiment to 'spread' the central solid angle of energy from the LED emitter 2 outward from the centerline. The merge point of surfaces 4 and 5 between zones A and B is found by construction. In the embodiment shown, surfaces 4 and 5 are tangent to each other or smooth at the merge point. However, it is not a requirement of the invention that they be tangent. Surface 3 of zone C is also defined in the embodiment shown as a surface generated by a tangent arc. It could, however, be generated by a line of revolution of any shape or slope. By using the tangent arc for surface 3 of zone C, some of the emitted rays incident on surface 3 from emitter 2 refract outward and some are totally internally reflected and proceed through the forward surfaces 4 and 5 of zones A and B. By controlling the arc radius and the segment angle of surface 3, the resultant beam can be defined in total and will include almost all the energy emitted by LED emitter 2. Measurements have shown that the resultant beam can include virtually the same number of lumens into an integrating sphere as the original LED does without lens 21.

Manipulation of the shapes of surfaces 3, 4 and 5 of FIG. 2 can be performed until the desired intensity ratios and angles of intensity are represented in a polar candela distribution plot of the design as depicted in FIG. 3. It must be understood that surfaces 3, 4 and 5 could be represented by any number of differently shaped surfaces including one or more which are point wise defined, rather than geometric shapes in zones as depicted. It is within the scope of the invention that the shape of the profiles of surfaces 3, 4 and 5 could be derived by computer calculation as a function of the desired beam profile as defined in the polar candela distribution plot and the resultant surface(s) profile used as the surfaces of revolution in the case of a radially symmetric design.

Figure 4:
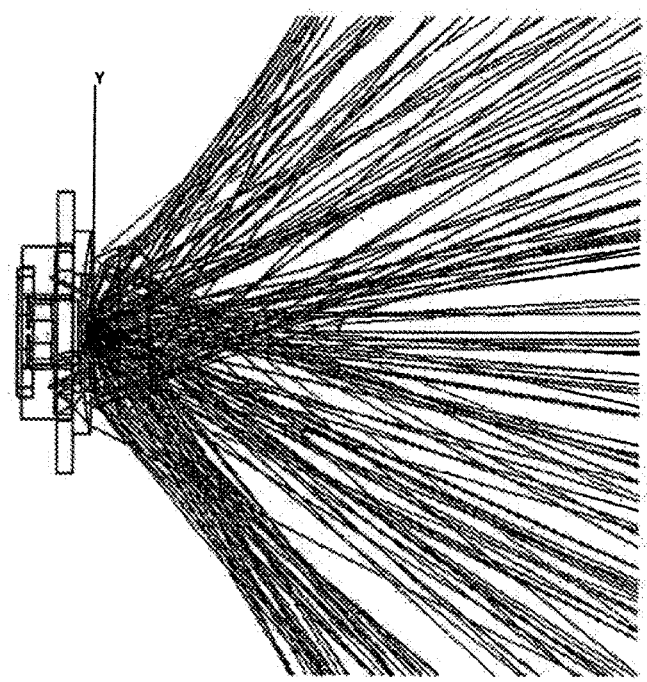
FIG. 4 is a side view of the embodiment of the invention described in FIGS. 1-3 showing a sample of rays traced from the source of the LED emitter through the al portion of the device.

FIG. 4 shows the result of a ray trace of the device 10 of FIGS. 1 and 2. The rays have been reduced to a small percentage of those traced to better show the effects of rays as they react to the surfaces 3, 4 and 5 of each of the above described zones A, B and C. Of course, it is understood that light rays from a ray trace only simulate the effects of light energy from a light source.

FIG. 5 shows a three quarter perspective view of another preferred embodiment 20 of the invention whereby the resultant beam energy pattern is not azimuthally symmetric.

Circular lip 18 of FIGS. 6-9 represents a sealing feature that optionally allows the device 20 to be sealed when built into a light fixture or an array. The cross sectional view of FIG. 9 is taken through section line D-D of FIG. 5. The top plan view of the device 20 is represented by the diametrically opposing 'blob' segments 14 and the diametrically opposing smoother side segments 15 azimuthally orthogonal to the blob segments 14. It is easier to understand these profiles by looking at FIGS. 7 and 8, which show the profiles of the segments 14 and 15 from both horizontal and vertical directions respectively, and FIG. 6 which shows the device 20 in a rotated oblique view that shows its elongated profile. It can be seen in FIG. 7 that the illustrated profile in this view is similar to the device 20 shown in FIGS. 1 and 2. However, the similarity is lost when you examine the azimuthally orthogonal profile of FIG. 8. The 'blob' shape in the embodiment of FIG. 7 is defined by multiple cross-sections of segments 14 and 15 rotated about the centerline 23 in which the surface of lens 21 is lofted between cross-sections of segments 14 and 15 much like the lofting of a boat hull. By manipulating the shape of cross-sections of segments 14 and 15, the 'blob' or lobed segment 14 is defined as well as the smoothing of surface segments between the diametrically opposing 'blobs' or lobes 14.

In the view of FIG. 9 it can be seen that the 'blob' or lobe segment 14 is defined similarly to the device 10 shown in FIG. 2. The zones A, B and C of the embodiment of FIG. 9 are similar as are the rays 25, 26 and rays 32-34 are similar to analogous rays 12, 11, 7, 8 and 9 respectively of FIG. 2. The undercut surface 31 as shown is flat, but it could be any shape or angle that provides the desired result. The undercut surface 31 of FIGS. 5-9 or surface 3 of FIGS. 1-4 differs from undercut surfaces which can be found in conventional total internal reflectors (TIR) in that the surfaces of the conventional TIR are located in what would be termed the far field of the LED and not its near field. In the present inventions surfaces 3 and 31 are near field surfaces in that they are optically closely coupled to the LED source and ideally have no air gap or at least no substantial air gap between the LED and the surface 3 or 31. Further, in a conventional TIR the undercut surfaces are generally used as reflective surfaces and to the extent that there are refracted rays emitted through such surfaces, the rays are lost to the useful beam or what is the intended beam of light. In the present invention the undercut surfaces 3 and 31 optically contribute to the intend beam to a material degree, both in the reflected as well as the refracted rays incident on them.

LED emitter 29 is disposed approximately at the center of the hemispherically shaped surface 17 of FIGS. 7 and 8, which matches the shape of dome 19. LED package 28 and the device 20 are optionally bonded with an index matching material at surface 17 of lens 21 and the dome 19 of the LED package 28. It is contemplated by the invention that the device 20 be incorporated in the production of the LED package 28 in an alternate embodiment whereby the manufacturer of the LED does not bond a separate lens 21 to the LED; however, the lens 21 of device 20 is the protective dome of the LED package 28 itself. In either case, the resultant devices 20 shall be very similar optically. The mechanical features at the base of the device are optional and may be utilized or not.

Figure 10:
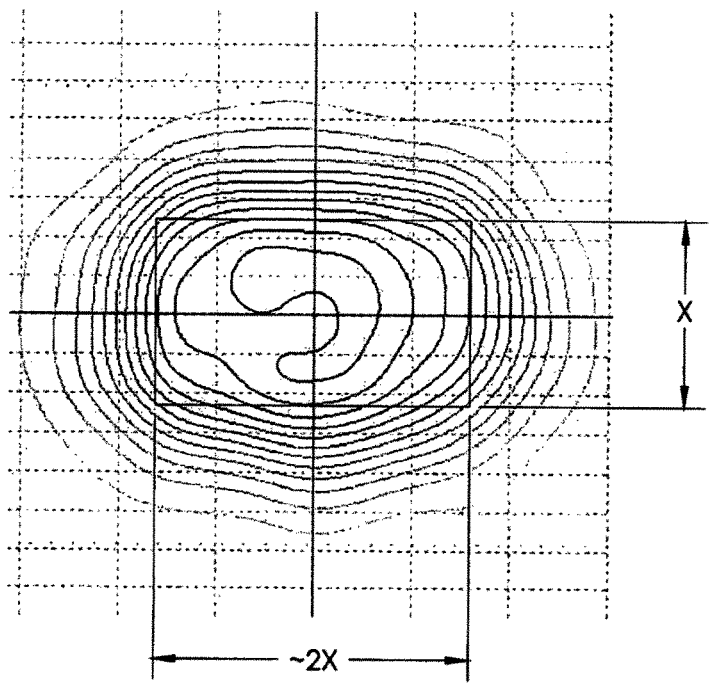
FIG. 10 is the two dimensional iso-footcandle plot of the device of FIGS. 5-9. This diagram illustrates the nonradially symmetric output of the device.
Figure 11:
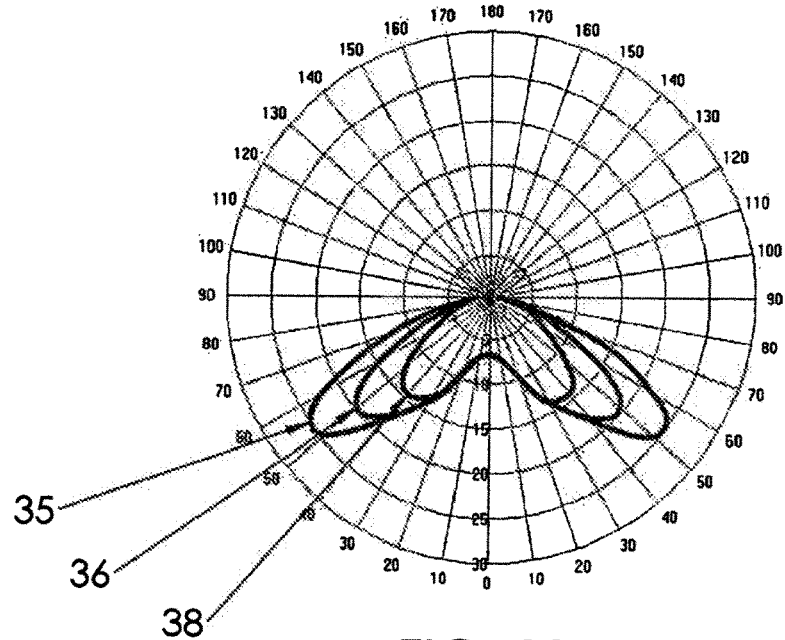
FIG. 11 is the iso-candela plot of the device of FIGS. 5-9 showing multiple plots of the device in different planes.

FIG. 10 shows a two dimensional iso-foot-candle plot of the output of the device 20 shown in FIGS. 5-9. It shows the anamorphic shape of the output beam which is nearly two times the length/width ratio of a azimuthally symmetric beam of the embodiment of FIGS. 1-4. FIG. 11 shows the polar iso-candela plot with overlaid angles of candela data. The plot 35 is the intensity distribution as seen in the horizontal plane of FIG. 7, plot 38 is the intensity distribution as seen in the azimuthally orthogonal plane of FIG. 8, and plot 36 is the intensity distribution as seen in a plane at 45 degrees or half way between the views of FIG. 7 and FIG. 8. The maximum of intensity distribution pattern decreases as the view rotates from the plane of FIG. 7 to the plane of FIG. 8 as shown in the plots 35, 36 and 38 and the decreases in angle or rotates upwardly from about 52 degrees to about 40 degrees off axis.

Figure 12:
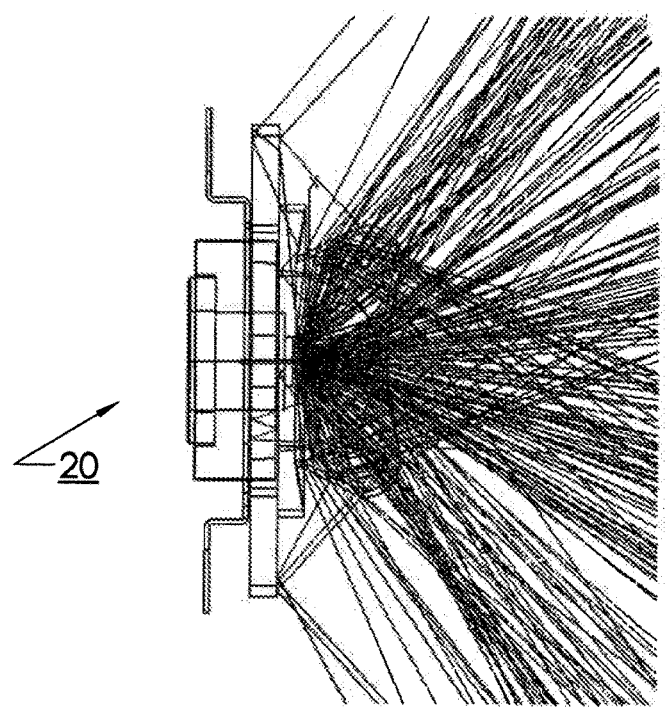
FIG. 12 is a side view of a ray tracing of the device of FIGS. 5-9 showing the rays traced from the LED emitter through the lens.
Figure 13:
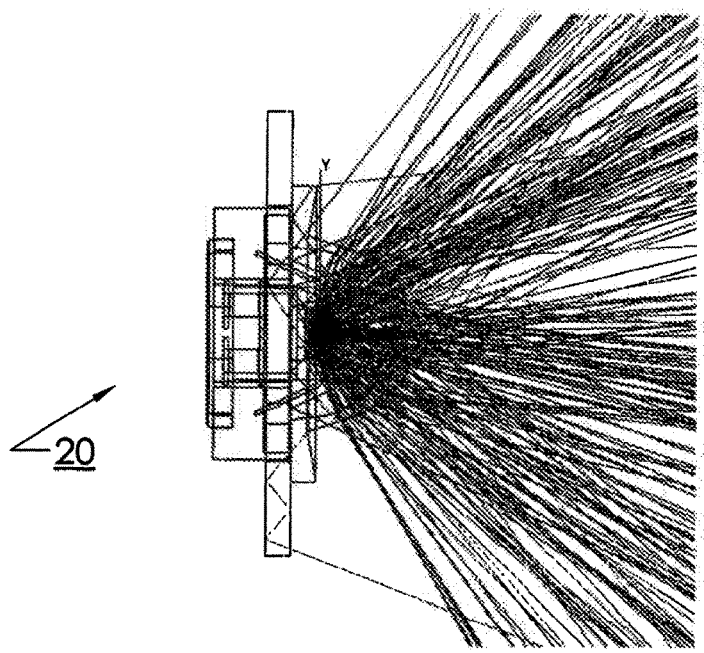
FIG. 13 is a side view of the same ray tracing shown in FIG. 12, from a view azimuthally rotated 90 degrees from the view of FIG. 12.

FIGS. 12 and 13 are ray trace plots of the device of FIGS. 5-9.

These plots show graphically the path of energy from the LED emitter 29 in the planes corresponding to FIGS. 7 and 8 respectively. As in the device 10 of FIGS. 1 and 2, the surface of zone C of FIG. 9 is both refractive and totally internally reflective in this embodiment of the invention.

Figure 14:
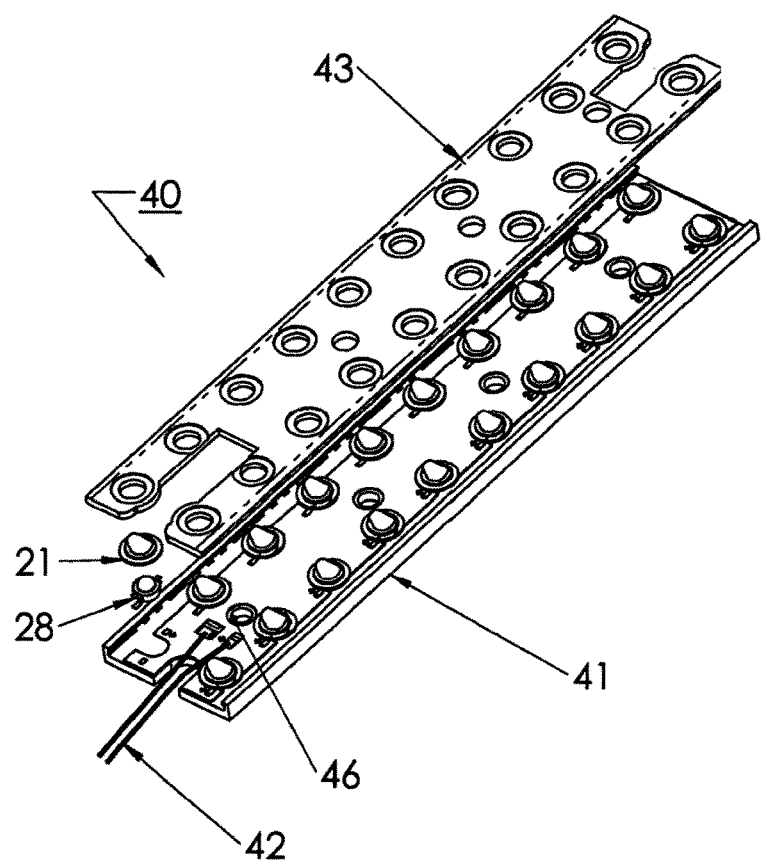
FIG. 14 is an exploded perspective view of a light module comprised of multiple devices of a preferred embodiment of the invention.
Figure 15:
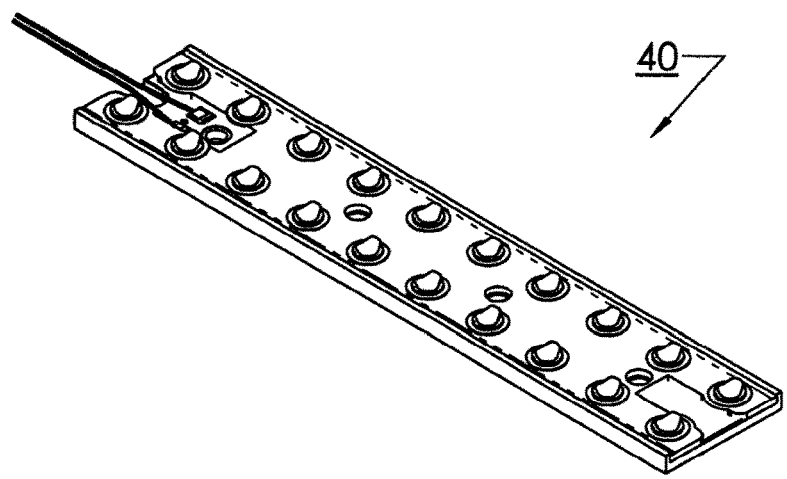
FIG. 15 is a perspective view of the assembled device of FIG. 14, a flat modular light bar.

FIGS. 14 and 15 illustrate a further embodiment of the invention which incorporates a plurality of devices 21 or 20 of the invention by which a light module 40 is provided. This light module 40, either individually or in multiple copies, can be the basis of a flat luminaire that is used for street lighting, pathway lighting, parking structure lighting, decorative lighting and any other type of spread beam application. Light module 40 is shown as a rectangular flat bar, but can assume any two dimensional planar shape, such as square, circular, hexagonal, triangular or an arbitrary free form shape. Inasmuch as light module 40 is flat it can be mounted in its corresponding fixture parallel to the two dimensional plane that it is intended to illuminate, such as the street, walk or floor. This results in the light be directed in a spread beam toward the useful two dimensional pattern for which it is intended and not skyward or in other nonuseful directions. The light module 40 is a very simple and low cost means to provide LED lighting to luminaire manufacturers where the light module 40 can be treated in the designs of as a single 'light bulb'. With the addition of heat sinking and power incorporated on or into module 40, the light module 40 can be easily incorporated into existing luminaires or integrated into new designs.

The exploded view of the light module 40 in FIG. 14 shows a disassembled conventional LED package 28 and the 'blob' lens 21 which is disposed onto LED package 28. FIGS. 14 and 15 further show a flat heat dissipating carrier 41 to which the LEDs 28 are attached. The flat carrier 41, which is typically made of metal, such as a heat conductive aluminum alloy, could provide just enough heat dissipation and conduction to allow proper cooling of the LED with the addition of a properly designed heat sink or other heat dissipating means, or the carrier 41 could be the entire heat sink or other heat dissipating means itself. A printed circuit board 46 is shown as a convenient means to provide power to the LEDs 28, however it could be eliminated and the LEDs could be wired to each other directly. Additional means of conveying power to the LEDs 28 are contemplated by the invention. The wires 42 shown are just one means of providing power to the light module 40. Connectors, sockets, plugs, direct wiring and other means are equivalent substitutes. The light module is covered by a molded component 43 or a co-molded cover 43 or any other means of providing a seal, such as a potting compound, or optionally no seal at all. An optional potting compound, which is forced or disposed between cover 43 and carrier 41, is just one means of providing sealing for the light module 40, rendering it in such an embodiment as waterproof or submersible. The assembled module 40 as shown in FIG. 15 can include hold down features, alignment features as well as other conventional features desired for implementation into a luminaire.

Figure 16:
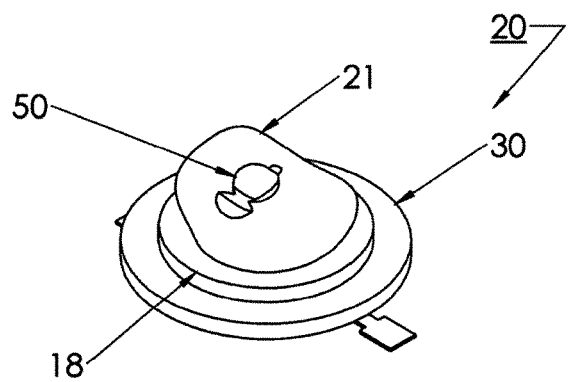
FIG. 16 is a perspective view of another preferred embodiment of the invention in which the device is asymmetric and creates a light pattern that is offset from a centerline of the LED.
Figure 17:
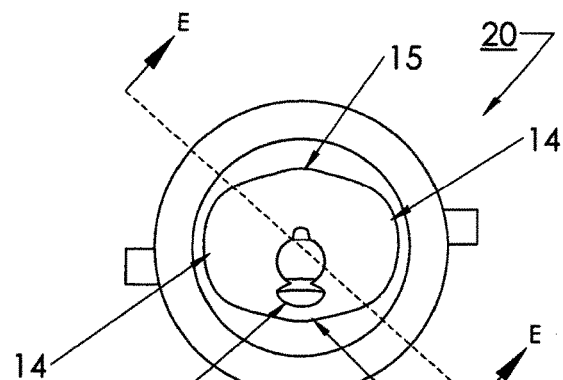
FIG. 17 is a top plan view of the device of FIG. 16.
Figure 18:
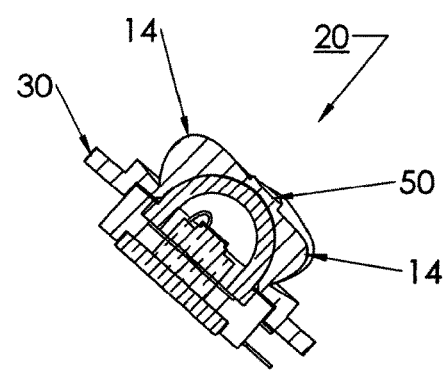
FIG. 18 is a cross sectional side view of the device of FIGS. 16 and 17 as seen through section lines E-E of FIG. 17.
Figure 19:
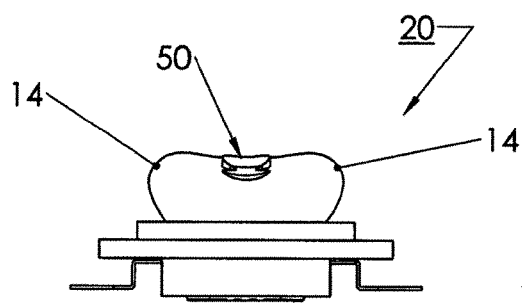
FIG. 19 is a side plan view of the device of FIGS. 17-18.
Figure 20:
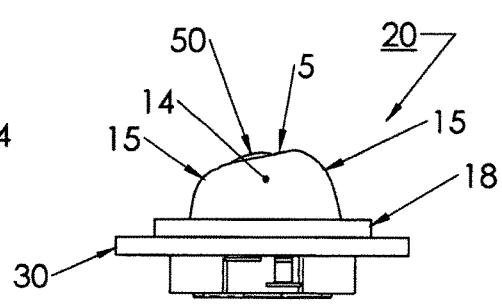
FIG. 20 is a side plan view of the device of FIGS. 17-19 as seen from a plane orthogonal to that seen in FIG. 19.

FIGS. 16-20 depict another preferred embodiment of the invention wherein the resultant 'beam' of light energy is directed in a skewed fashion with respect to the centerline of the device 20. The beam can be defined as having 'lobes' of intensity that are not coincident with the primary axes of the device 20. The device shown in FIG. 16 is similar to FIG. 6 in all respects with two exceptions, first there a complexly shaped prism 50 is provided on the top of lens 21 and the second is described as follows. As best shown in the top plan of FIG. 17 lobes 14 are similar to lobes 14 in FIG. 5 while the flattened sides 15 are slightly radially extended with a central bulge. Prism 50 is complexly shaped to provide a means for directing light in zone A into a direction which is more dramatically skewed relative to centerline 23. In addition, as best shown in FIG. 20 the top surface 5 is angled off axis to further skew the light in the same general direction to which prism 50 is directed. Prism 50 has at least four separately definable surfaces, which in plan view vaguely resemble the top plan surface of a toilet and water closet. The surfaces are empirically determined by trial and error from the desired skewed polar candela plot and are strongly dependent thereon. Therefore, the surfaces of prism 50 will not be described in greater detail other than to specify that the net effect is to redirect the light incident on prism 50 from within lens 21 toward one side of the light pattern skewed relative to the centerline 23.

Turn now to FIGS. 21-26 wherein another embodiment of the invention is depicted. FIG. 21 is a perspective view of the device, generally denoted by reference numeral 10. FIG. 22 shows the device 10 in another perspective view. Optional flange 30 is shown to have a keyed shape that allow the lens 21 to be rotationally indexed in an assembly or fixture (not shown). The flange 30 may also be utilized to seal the LED housed in lens 21 into an assembly by a mating part (not shown) that interfaces or interlocks with the flange 30. Optional seal 18 is shown as a part of the flange 30 and may be incorporated into it by many different means.

Surfaces 57 and 58 of lens 21 are utilized to direct the energy from the LED's peripheral beam, which is defined as the energy radiating in the solid angular zone from a horizontal plane parallel to the plane of the LED emitter to approximately 45 degrees from the perpendicular centerline of the LED emitter, while surfaces 51, 52 and 59 direct the energy in the solid angular zone from the LED's centerline to approximately 45 degrees from the centerline, the primary LED director. One very important element of the invention is the zone of the lens 21 depicted by surfaces 51 and 70. The surfaces 51 and 70 form the principle parts of a complex prism on the surface of lens 21, which is called a "Pope's hat". The solid angle zone of the light served by surfaces 51 and 70 takes the energy from the primary directed beam of the LED's 'curb' side and redirects it toward the 'street' side.

Optional surface 53 is a blended contour between surfaces 52 and 58. Surface 57 is mirrored across intersection 54 in FIG. 23 and is lofted in the embodiment shown to redirect the centerline energy of the LED down the 'curb' direction. Surface 57 allows for very high efficiency for the lens 21 in both the street and the curb side of its light pattern.

In FIG. 23, surface 52 is depicted as an azimuthally symmetric surfaced defined through an azimuthal angle of about 185 degrees. While this is desirable for some applications it is well within the scope of the invention that surface 52 and its adjacent surfaces may be azimuthally asymmetric. Surface 59 is an optional feature to redirect the centerline energy of the LED. Surface 59 can take of many different forms to allow the designer freedom to shape the beam. In the embodiment of FIGS. 21-26 the shape of surface 59 is utilized to allow for a continuation of the light spreading effect of surface 52, but constrained to keep the thickness of the device 10 within manufacturing capabilities.

In FIG. 24, interface 62 between dome 19 and lens 21 is utilized if the lens 21 is a molded optic separate from the LED. If the lens 21 of the device 10 were molded directly on or assembled by the manufacturer on the LED emitter, interface 62 does not exist. Interface 62 is comprised of the two mating surfaces of the LED dome 19 and the inside of the lens 21. It would be most desirable if the interface were bonded with an index matching cement or a thixtropic index matching material were retained in interface 62. Using an index matching material, optical measurements have shown that the resultant beam from the assembled device 10 can include virtually the same number of lumens into an integrating sphere as the original LED does without lens 21.

Figure 27:
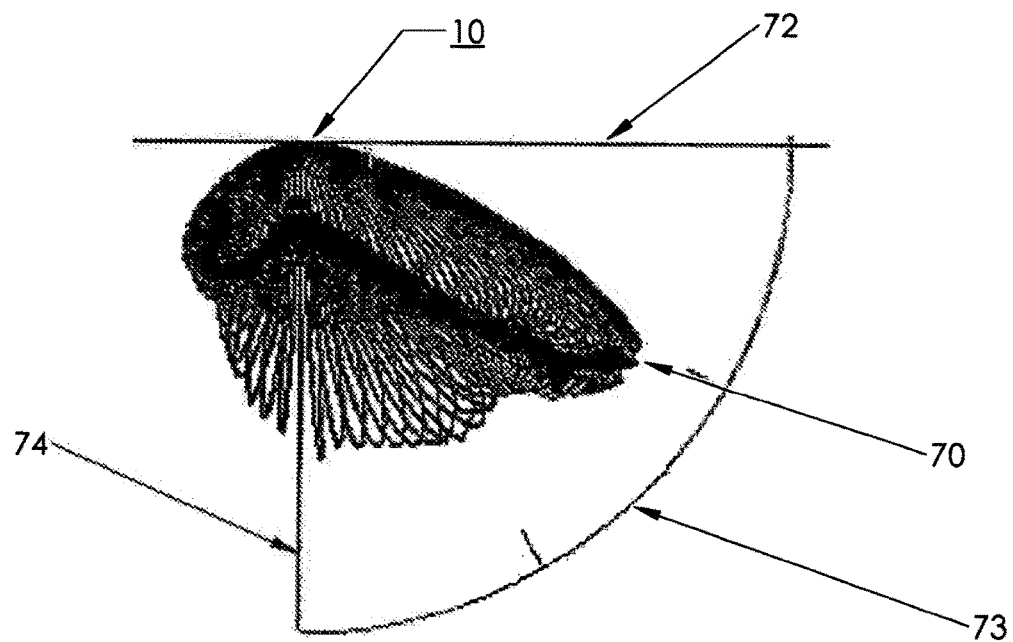
FIG. 27 is a side view of a three dimensional iso-candela mapped plot of the output of a device of FIGS. 21-26, clearly showing the azimuthally asymmetric output of the device. The 'street' side of the beam is depicted to the right in the drawing and the curb side to the left. The plot illustrates that the invention can create a beam profile that generates the full-cutoff beam type required by IES standards for roadway and outdoor lighting.
Figure 28:
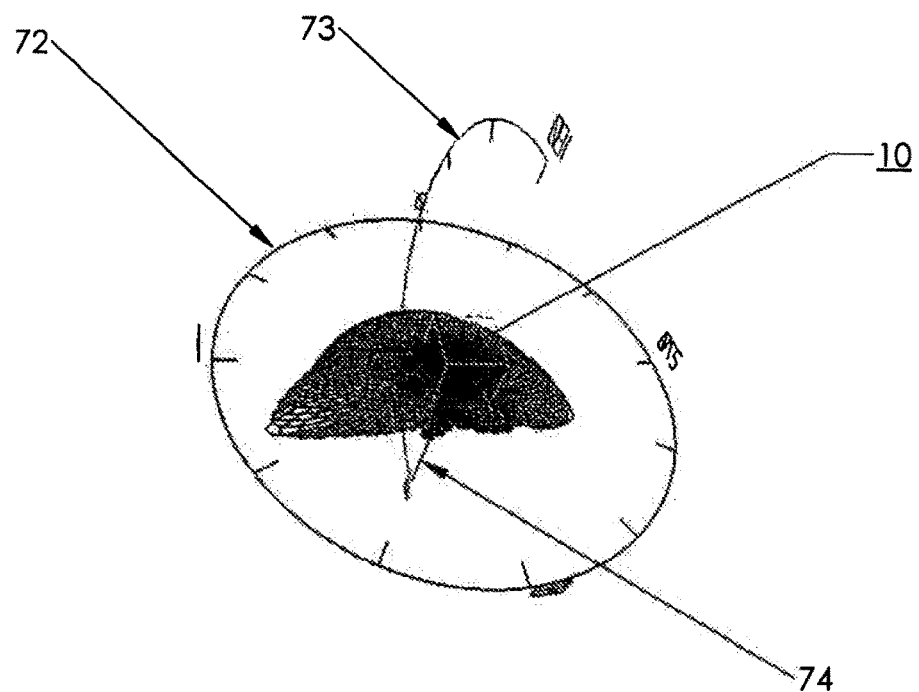
FIG. 28 is a rotated perspective view of the iso-candela map of FIG. 27 showing the output of the device as seen from the 'curb' side and from above the device. It shows the bias of the beam toward the street and down the curb line.

The nadir 74 of the device 10 is shown in FIG. 27 as well as is the horizon 72 and the 'street' side angle marker 73. The rays 70 of maximum candela of the resultant beam are illustrated in the rightmost portion of the drawing. FIG. 28 is a rotated three dimensional view of the same candela map as FIG. 27 and shows the plot as it would be seen from the curb side of the pattern at the bottom portion of the view. The ability of the various surfaces of lens 21 described in FIGS. 21-26 to throw or transfer energy from one side of the Lambertian output of the conventional LED to one side of the illumination pattern is graphically illustrated. Note also that all the rays are directed in FIG. 27 in a downward direction with little if any energy in the direction of horizon 72 or upward. Sky rays are virtually eliminated.

Manipulation or modification of the shape and position of surfaces 52, 53, 58, 57, 54, 51, 70 and others defining lens 21 as shown in FIGS. 21-23 can be performed until the desired intensity ratios and angles of candela are represented in a ray trace of the design as depicted in FIGS. 27 and 28 or modifications thereof according to the teachings of the invention. It must be understood that the lens surfaces could be represented by any number of separate surfaces including one or more which are defined by a point wise transfer function rather than geometric segmental shapes. It is entirely within the scope of the invention that the shape of the profiles of the lens surfaces could be derived by a computer calculation derived from a predetermined beam profile and the resultant lens surface(s) profile(s) then used as the cross-section(s) of various portions of the lens 21 according to the teachings of the invention.

Figure 29:
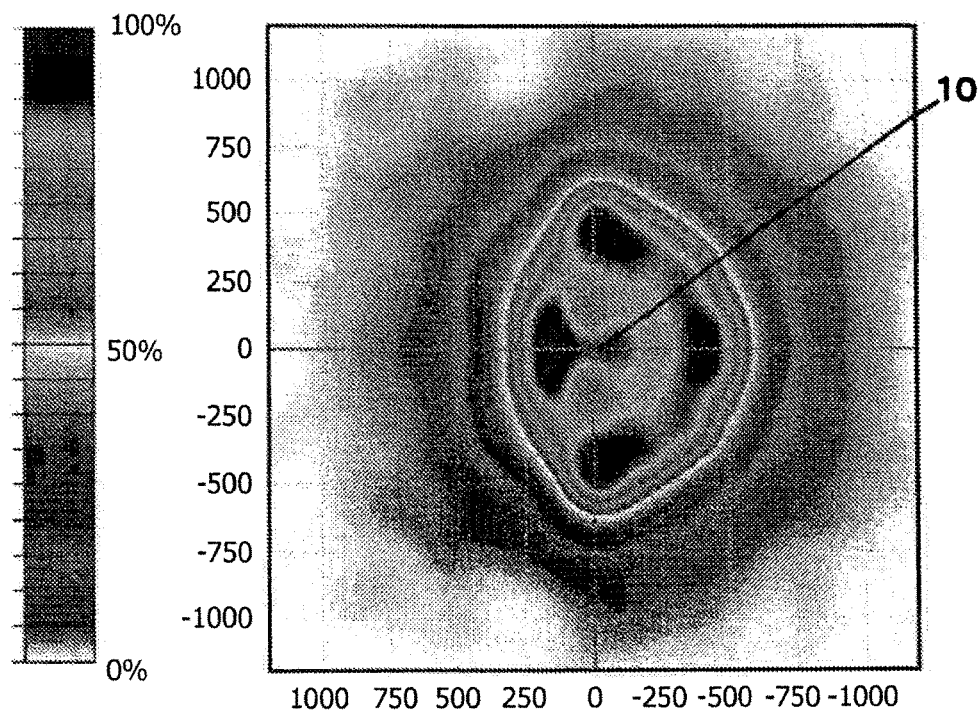
FIG. 29 is a two dimensional iso-foot-candle plot of the light beam projected onto the 'street' from a device of the invention. This shows the nonradially symmetric output of a device of FIGS. 21-26. The designer has the freedom to control the shape of the lens to alter the output to match the requirements of the lighting task.

FIG. 29 is a plot of the two dimensional distribution of energy as it strikes the surface of the 'street' below the device 10. This plot generally would be described with iso-intensity contour lines in units of energy such as footcandle or lux. The device 10 is centered in the drawing of FIG. 29 with the 'street' side to the right of center and the 'curb' side to the left of center. The plot is symmetry about a horizontal line running from the curb to the street with identical intensity patterns in the top and bottom portions of the drawing.

Figure 30:
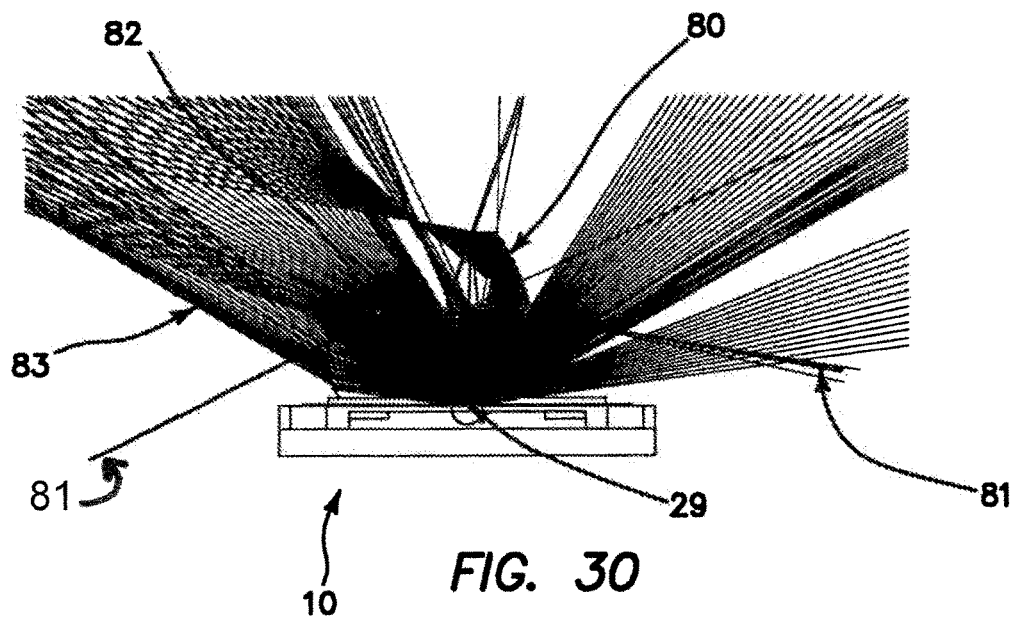
FIG. 30 is a cross-sectional view of a device of FIGS. 21-26 overlaid on a sample ray trace of the energy radiating from the LED emitter. The view of FIG. 30 is the mirror image of the view of FIG. 25. This view is upside down with the 'street' side facing to the left and above and shows refraction and reflection of various surfaces of the lens.

FIG. 30 is a ray tracing of the device 10 of FIGS. 21-26 as seen in a side view reversed from that shown in FIG. 25. The rays have been reduced to a small percentage of those which could be traced to better show the effects of rays as they are redirected from the Lambertian pattern of the LED housed within lens 21 by the surfaces of the lens 21. Rays 82 correspond to the rays directed by surface 52. Rays 83 are directed by undercut surface 58. FIGS. 24-26 show a small undercut portion of surface 58 which extends partially around the base of lens 21. Surface 57 in the view of FIG. 25 has no or little undercut, while the basal portions of surface 58 have a small undercut which smoothly transitions into surface 57. It should be noted in FIG. 30 that rays 80 which are redirected from surface 51 show that surface 51 is acting as a TIR reflector of the beam energy from the LED on the 'curb' side to transfer energy to the 'street' side. Rays 81 are refracted LED energy in a direction away from the centerline of the LED beam pattern. Stray rays 81 show losses which arise in the lens 21 as a result of manipulating the beam pattern.

The emitter 29 in the LED is assumed above to be a Lambertian emitter. The concept of using a 'floating' reflective surface on the 'curb' side of lens 21 to reflect light to the 'street' side of a lens 21 is expressly included within the scope of the invention even when using HID or other light sources with different emission patterns. Any kind of light source now known or later devised may be employed in the disclosed combination of the invention with appropriate modifications made according to the teachings of the invention. Wherever in this description the terms associated with streetlights are used, such as 'street' side or 'curb' side, they could be substituted with other terms that describe offset beam patterns in general.

Figure 31:
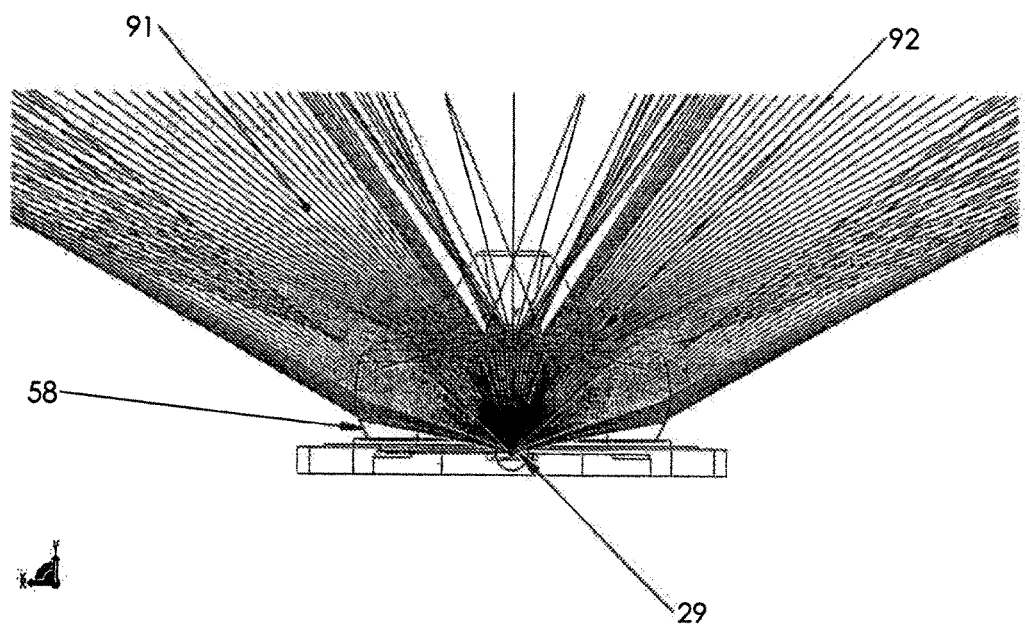
FIG. 31 is a cross-sectional view of a device of FIGS. 21-26 overlaid on a sample ray trace of the energy radiating from the LED emitter. This is a view similar to the view of FIG. 24.

FIG. 31 is another cross-section view of a ray tracing of the embodiment of FIGS. 21-26 as seen in a frontal view of FIG. 26. The rays radiating from the side plan view of FIG. 26 are refracted toward the street surface. Rays 91 represents the energy from the LED in the primary zone refracted outward by the surface 52 of FIGS. 21-26. Again few if any rays directed toward the horizon are present.

Figure 32:
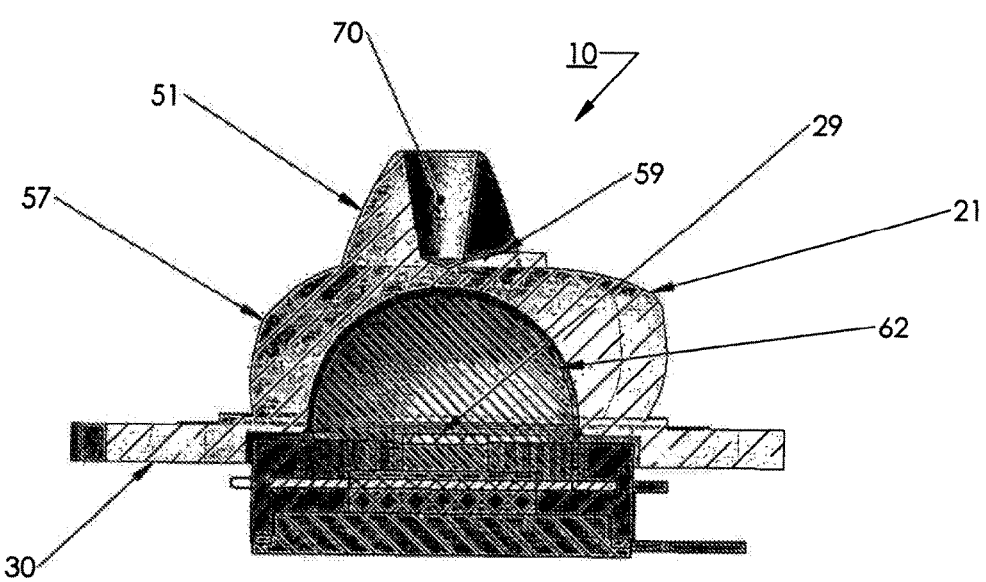
FIG. 32 is the cross-sectional view of the device of FIGS. 21-26 as seen through section lines F-F of FIG. 23. This view illustrates the assembly of the device of FIGS. 21-26 with the LED.

FIG. 32 is a solid cross-sectional view of device 10 as seen through line F-F of FIG. 23. FIG. 32 shows an LED with emitter 29 with lens 21 optionally glued in place with the interface 62 or seam bonded with an index matching cement. The optional flange 30 can be seen as a sealing feature to mate with additional components of an assembly (not shown). Surface 57 represents the transition between the 'street' side profiles and the 'curb' side profiles of lens 21 that mainly refract light toward the street from the peripheral Lambertian beam of the LED. More particularly, surface 57 is divided into two subsurfaces by a centerline 54 in the embodiment of FIGS. 21, 23 and 24, which subsurfaces spread the light in the beam outward from the centerline 54 in larger angles. For example, if in one embodiment centerline 54 were perpendicularly oriented to the curb in a street light installation, the subsurfaces would spread the beam transmitted through surface 57 in directions more parallel to the curb and away from the centerline 54. Surface 51 primarily reflects energy from the LED primary light direction from the 'curb' side toward the 'street' side.

Figure 33:
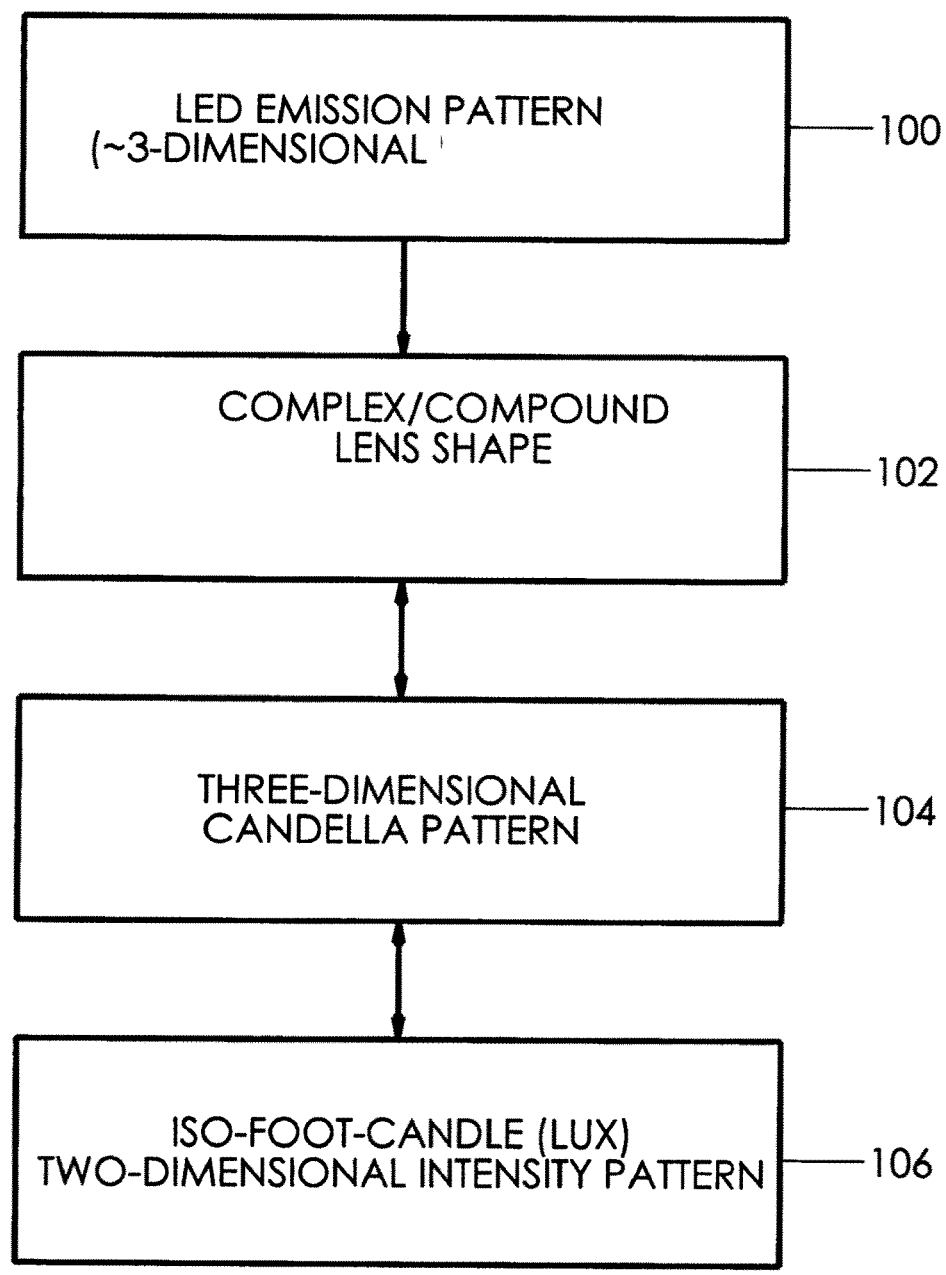
FIG. 33 is a block diagram showing the steps of a method where a transfer function is employed.

FIG. 33 summarizes an overall conceptualization of the methodology of the invention. The problem solved by the invention is defined by two boundary conditions, namely the light pattern of the light source which is chosen at step 100 and the two dimensional iso-foot candle plot which is to be projected onto the surface which is intended to be illuminated in step 106. In the illustrated embodiment the problem of providing a wide beam street light pattern is assumed for the boundary condition of step 106 and the Lambertian pattern of an LED is assumed in the boundary condition 100. Thus, it can readily be understood that the same problem defined by different characterizations of the boundary conditions of steps 100 and 106 are expressly included within the scope of the claimed invention. For example, if has already be expressly mentioned that boundary condition 100 need not assume the Lambertian pattern of an LED, but may take as the boundary condition the three dimensional energy distribution pattern of a high intensity discharge (HID) lamp.

The problem then becomes recast as how to get the shape of a lens or optic 21 which provides the needed transfer function between the two boundary conditions of steps 100 and 106, namely the three dimensional energy distribution pattern of the light source to the projected two dimensional illumination pattern for the target surface. The problem is nontrivial.

The solution for an asymmetric broad or spread beam has been disclosed in connection with FIGS. 1-32 above and the related specification. Once a three dimensional lens shape is determined at step 102 as shown in FIGS. 1-9, 16-20 and 21-26, the three dimensional candela plot as shown in FIGS. 11, 27 and 28 and as suggested by the ray tracings of FIGS. 12, 13, 30 and 31 can be mathematically derived using conventional optical computer aided design programs, such Photopia® sold by Lighting Technologies of Denver, Colo., assuming the three dimensional energy distribution of the light source, e.g. a Lambertian distribution in the case of an LED.

Given the three dimensional candela plots, the two dimensional iso-foot candle plots of FIGS. 10 and 29 can be mathematically derived using conventional optical computer aided design programs. The results obtained are then compared to the boundary condition of step 106. To the extent that the boundary condition of step 106 is not satisfied, the optical designer through trial and error can modify the three dimensional shape of lens 21 in step 102 and again repeat steps 104 and 106 in a reiterative process until the desired conformity with the target two dimensional iso-foot candle plot is obtained.

The invention also includes the methodology where the needed lens shape is rendered mathematically through an analytical process or numerically through a numerical reiterative estimation process with the boundary conditions of steps 100 and 106 as numerical inputs consistent with the teachings of the invention.

It can also thus be appreciated that a plurality of such devices can then be combined into an array of devices. Each device in the array has the same three dimensional energy distribution pattern that results in the same intended two dimensional illumination pattern on the target surface or street. When a plurality of such devices are closely spaced together in the array relative to the size of the illumination pattern on the target surface or street, their respective illumination patterns are substantially linearly superimposed on each other to provide the same illumination pattern on the target surface or street as produced by a single device, but with the increased intensity of the plurality of devices in the array. Similarly, the arrays can be manufactured in a modular fashion, so that a plurality of arrays combined together can still have a relatively small size compared to the distance to or the size of the illumination pattern on the target surface or street, that the illumination pattern of each array substantially overlays the same illumination pattern of all the other arrays in the collection. Hence, the intensity of the illumination pattern on the target surface from the collection of arrays can be scaled without substantial modification of the illumination pattern by modular scaling of the arrays into larger or smaller collections.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. A luminaire comprising:
a substrate; and
an array of a number of light sources mounted to the substrate such that each light source is pointing in a same direction, each light source comprising:
a light emitting diode that has an axis; and
an optic that receives light from the light emitting diode and directs the received light to produce an illumination pattern that has a first intensity, wherein the optic comprises an inner hemispherical surface, the optic is symmetric with respect to a first reference plane passing through the axis, and the optic comprises a reflecting feature on a first side of a second reference plane, the second reference plane perpendicular to the first reference plane, wherein the reflecting feature reflects a portion of the light toward a second side of the second reference plane that is opposite the first side of the second reference plane,
wherein the array of the number of light sources produces a scaled version of the illumination pattern with a second intensity that substantially equals to the first intensity multiplied by the number.

2. The luminaire of claim 1, wherein the luminaire comprises a streetlight, and
wherein the illumination pattern is skewed so as to bias the scaled version of the illumination pattern street side relative to curbside for a streetlight installation.

3. The luminaire of claim 1, wherein the reflecting feature is a totally internally reflective surface that is oriented to skew the illumination pattern relative to the axis, and
wherein the array of the number of light sources comprises at least one light module.

4. The luminaire of claim 1, wherein the optic comprises an indentation, and
wherein the optic is substantially symmetrical about a plane of symmetry that is aligned with the indentation.

5. The luminaire of claim 1, wherein the optic comprises an indentation, and
wherein the optic is symmetrical about a reference plane that passes through the indentation.

6. A luminaire comprising:
a substrate configured for mounting above an area to be illuminated; and
a plurality of light sources that are mounted to the substrate such that each light source is disposed at a same angle with respect to the substrate, each light source comprising:
a light emitting diode; and
an optic that receives light from the light emitting diode and directs the received light to produce an illumination pattern, wherein the optic comprises an inner hemispherical surface, the optic is symmetric with respect to a first reference plane, and the optic comprises a light redirecting feature on a first side of a second reference plane, the second reference plane perpendicular to the first reference plane, wherein the light redirecting feature redirects a portion of the light toward a second side of the second reference plane that is opposite the first side of the second reference plane.

7. The luminaire of claim 6, wherein the plurality of light sources comprises an array of light sources within a streetlight.

8. The luminaire of claim 6, wherein the light redirecting feature is a refractive surface of the optic.

9. The luminaire of claim 6, wherein the light redirecting feature is a reflective surface of the optic.

10. The luminaire of claim 6, wherein the light redirecting feature is a surface of the optic that is both refractive and reflective.

11. The luminaire of claim 6, wherein the optic comprises an indentation on an outer surface of the optic.

12. The luminaire of claim 11, wherein the indentation is symmetric with respect to the first reference plane.

13. The luminaire of claim 6, wherein the substrate and the light sources form a light module.

14. The luminaire of claim 6, wherein the light emitting diode is centered with respect to the inner hemispherical surface of the optic.

15. The luminaire of claim 6, wherein each light emitting diode of the plurality of light sources has an axis and the first reference plane and the second reference plane pass through the axis.

16. A luminaire comprising:
a substrate configured for mounting above an area to be illuminated; and
a plurality of light sources that are mounted to the substrate at the same angle to the substrate and that collectively provide a collective beam pattern for illuminating the area, each of the light sources comprising:
a light emitting diode; and
an optic disposed adjacent the light emitting diode to form an individual beam pattern from light emitted by the light emitting diode, the optic comprising:
a first surface defining a hemispherical cavity disposed to receive the light emitted by the light emitting diode; and
a second surface that is disposed opposite the first surface and that is configured for creating asymmetry in the individual beam pattern.

17. The luminaire of claim 16, wherein the plurality of light sources comprises are disposed within a streetlight.

18. The luminaire of claim 16, wherein the second surface comprises a reflecting portion.

19. The luminaire of claim 18, wherein the reflecting portion is disposed at a periphery of the second surface.

20. The luminaire of claim 16, wherein the optic comprises an indentation on an outer surface of the optic.

* * * * *

UNITED STATES PATENT AND TRADEMARK OFFICE
CERTIFICATE OF CORRECTION

PATENT NO.        : 10,174,908 B2
APPLICATION NO.   : 15/083076
DATED             : January 8, 2019
INVENTOR(S)       : Ronald G. Holder and Greg Rhoads Page 1 of 1

It is certified that error appears in the above-identified patent and that said Letters Patent is hereby corrected as shown below:

In the Claims

Claim 17: Column 21, Line 19, after "light sources" please delete the word "comprises".

Signed and Sealed this
Twenty-sixth Day of March, 2019

Andrei Iancu
*Director of the United States Patent and Trademark Office*